USOO5238525A

United States Patent [19]
Turner et al.

[11] Patent Number: 5,238,525
[45] Date of Patent: Aug. 24, 1993

[54] ANALYSIS OF RHEED DATA FROM ROTATING SUBSTRATES

[75] Inventors: George W. Turner, Chelmsford, Mass.; Adrian J. Isles, Silver Spring, Md.

[73] Assignee: Massachusetts Institute of Technology, Cambridge, Mass.

[21] Appl. No.: 826,844

[22] Filed: Jan. 27, 1992

Related U.S. Application Data

[63] Continuation-in-part of Ser. No. 582,755, Sep. 14, 1990, Pat. No. 5,122,222.

[51] Int. Cl.$^5$ ............................................. C30B 25/16
[52] U.S. Cl. ..................................... 156/601; 156/610; 156/611; 156/612; 156/DIG. 102; 437/105; 422/105; 118/716; 118/719
[58] Field of Search .............. 156/601, 610, 611, 612, 156/DIG. 102, DIG. 103; 118/716, 719; 422/105; 437/105

[56] References Cited

U.S. PATENT DOCUMENTS

| | | | |
|---|---|---|---|
| 4,508,590 | 4/1985 | Kaplan et al. | 156/601 |
| 4,806,321 | 2/1989 | Nishizawa et al. | 156/601 |
| 4,812,650 | 3/1989 | Eckstein et al. | 156/601 |
| 4,855,013 | 8/1989 | Ohta et al. | 156/601 |
| 4,878,989 | 11/1989 | Purdes | 156/613 |
| 4,931,132 | 6/1990 | Aspnes et al. | 156/601 |
| 5,091,320 | 2/1992 | Aspnes et al. | 156/601 |
| 5,122,222 | 6/1992 | Turner et al. | 156/601 |

FOREIGN PATENT DOCUMENTS

| | | |
|---|---|---|
| 61-278128 | 12/1986 | Japan . |
| 63-215591 | 9/1988 | Japan . |
| 63-222092 | 9/1988 | Japan . |
| 1-131440 | 5/1989 | Japan . |

OTHER PUBLICATIONS

Sakamoto et al., in "Thin Film Growth Techniques for Low-Dimensional Structures", edited by R. F. C. Farrow and S. S. P. Parkin (Plenum, NY, 1986), pp. 225-245.

"Current Understanding and Applications of the RHEED Intensity Oscillation Technique", Dobson et al., *Journal of Crystal Growth 81* (1987) pp. 1-8.

"The Application of RHEED Intensity Effects of Interrupted Growth and Interface Formation During MBE Growth of GaAs/(Al,Ga)As Structures", Joyce et al., *Appl. Phys. A 45*, (1968) pp. 255-260.

"Frequency-Domain Analysis of Time-Dependent Reflection High-Energy Electron Diffraction Intensity Data", Turner et al., *J. Vac. Sci. Technol.* B 8(2), Mar./Apr. 1990, pp. 283—287.

"On the Accuracy of MBE Cell-Temperature Calibration Investigated by Frequency Domain Analysis of RHEED Intensity Oscillations", Kraus et al., *Euro MBE 1991*, Tampere, Jan. 30, 1991.

"Effects of Diffraction Conditions and Processes on RHEED Intensity Oscillations During the MBE Growth of GaAs", Neave et al., *Appl. Phys.* A 42, (1987), pp. 317-326.

"Multiple Reflection High-Energy Electron Diffraction Beam Intensity Measurement System", Resh et al., *Rev. Sci. Instrum.* 61 (2) Feb. 1990, pp. 771-774.

A. J. SpringThorpe and A. Majeed, "Epitaxial Growth Rate Measurements During Molecular Beam Epitaxy", *J. Vac. Sci. Technol.*, B 8(2) (Mar./Apr. 1990).

*Primary Examiner*—Robert Kunemund
*Attorney, Agent, or Firm*—Hamilton, Brook, Smith & Reynolds

[57] ABSTRACT

A video tracking system and a program employing frequency-domain analysis for extracting RHEED intensity oscillation data for film growth on rotating substrates. In initial experiments on GaAs growth, excellent (2%) agreement has been obtained between oscillation frequencies measured for static substrates and substrates with rotation rates as high as 10 rpm. The capability of performing RHEED analysis on rotating substrates could lead to improvements in the quality of complex epitaxial structures and interfaces for which interrupting rotation can have a deleterious effect.

16 Claims, 7 Drawing Sheets

ANALYSIS OF RHEED DATA FROM ROTATING SUBSTRATES

GOVERNMENT SUPPORT

The Government has rights in this invention pursuant to Contract Number F19628-90-C-0002 awarded by the Department of the Air Force.

RELATED APPLICATIONS

This is a continuation-in-part of U.S. application Ser. No. 07/582,755 filed on Sep. 14, 1990, now U.S. Pat. No. 5,122,222 incorporated herein by reference.

COPYRIGHT

Appendix A of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND ART

Measurement of film thickness during growth is required in a number of arts and especially in the growth of thin film semiconductors on substrates. Such films may comprise amorphous or polycrystalline or epitaxial films. Such films may be grown or deposited in a variety of reactors. One such reactor is a molecular beam epitaxy (MBE) reactor.

Recently, the examination of images formed by in situ reflection high-energy electron diffraction (RHEED) intensity data has become one of the more useful tools for the analysis of growth by MBE. Static RHEED images, obtained when growth is interrupted, yield detailed information on surface reconstruction. Analysis of dynamic RHEED images ("RHEED oscillations"), plotted as a function of intensity versus time, and obtained as growth is taking place, can be employed to determine epitaxial growth rates and, therefore, alloy compositions. (See U.S. Pat. No. 4,855,013 issued Aug. 8, 1989.) This method is applicable because epitaxial growth causes a variation in surface roughness on the atomic scale that, under favorable conditions, produces well-resolved oscillations in the RHEED intensity. The period of these oscillations is the time required for the growth of one complete monolayer. Frequently, however, the conditions used for epitaxial growth yield oscillations that are not sufficiently obvious to permit the period to be obtained directly from plots of intensity versus time. Another major disadvantage with current known RHEED oscillation analysis methods is that substrate rotation, which is generally employed in order to improve uniformity of the growing films and interfaces, must be stopped in order to obtain a fixed diffraction pattern from which oscillation data can be obtained.

A need exists, therefore, for a method and apparatus which permits analysis of RHEED or other oscillations under unresolved growth conditions and which permits the acquisition of RHEED oscillation data while the substrate continues to rotate.

SUMMARY OF THE INVENTION

In accordance with the present invention, digital signal processing and frequency-domain analysis is used to enable a growth oscillation frequency to be extracted from data obtained during substrate rotation.

In accordance with the invention, a layer of material being grown on a rotating substrate in a reactor is subjected to an energy beam. Oscillatory variation in the beam, resulting from beam incidence on the growing material, are imaged and converted into frames of picture elements (pixels). Each frame is processed to produce a time varying pattern of the beam variations. The time varying pattern is converted to a frequency varying pattern to disclose pattern characteristics not readily observable in the time domain. These characteristics may be used to control growth process parameters.

DETAILED DESCRIPTION OF THE INVENTION

Figure 1:
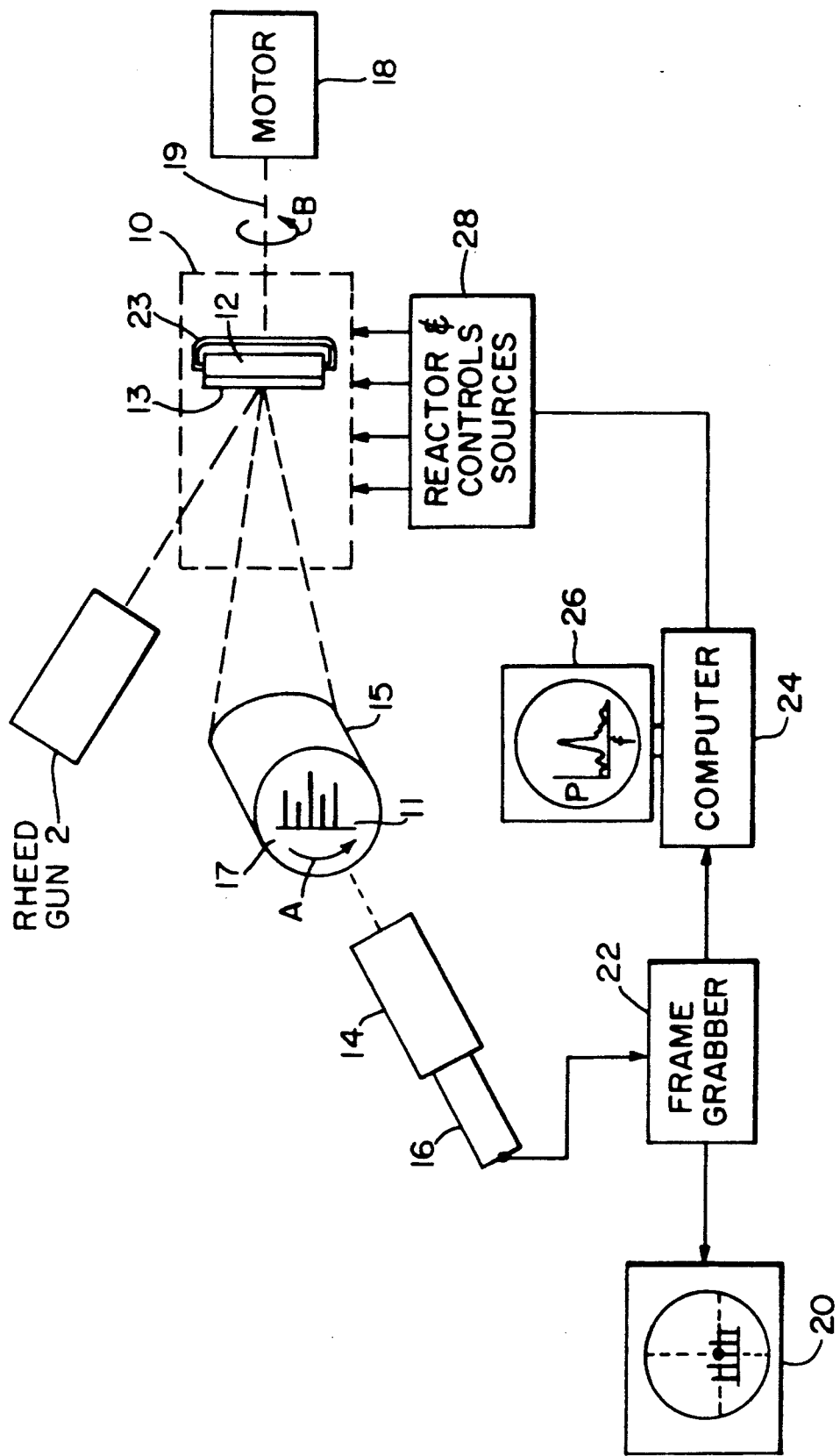
FIG. 1 is a schematic diagram of a measurement system in accordance with the invention.

The invention will now be described in detail in connection with the drawings. FIG. 1 is a schematic drawing of a preferred embodiment of the system of the invention, as illustrated by a RHEED measurement system, in accordance with the invention.

An MBE reactor 10, such as a Varian GEN II modular 3-in (MBE) reactor system 10 may be used for the growth of films 13 of various materials on various substrates 12. Typically such materials comprise Group III-V film materials and substrates. For example, GaAs substrates may be prepared by chemical cleaning and etching followed by mounting on In on Mo blocks (not shown) and in situ oxide desorption at about 600° C. The substrate temperature during growth is maintained at about 600° C. as monitored by thermocouple and optical pyrometer measurements (not shown). Typical growth conditions are employed, including an $As_4$/Ga beam equivalent pressure of about 10 and a growth rate of about 1 μm/h.

A RHEED image 11 is generated by subjecting growing film 13 in reactor 10 to an electron beam (E-Beam) with a standard Varian RHEED electron gun 2 operated at 8 kV with an emission current of 2-3 A. During growth, the vertically mounted substrate 12 is rotated by motor 18 coupled by shaft 19 to substrate holder 23. The resultant image is shown on the phosphor screen 17 of RHEED screen 15. The image shown is that of a 2×4 As-stabilized RHEED pattern at the region of specular reflection where the E-beam is exiting at a near angle of incidence. The pattern will move as indicated by arrow A, when the substrate is rotated in the direction of arrow B. The moving image is captured by a CCD TV camera 16 equipped with a macro lens 14 that permits the magnification of any part of the image.

TV camera 16 is a CCD camera with RS-170 video output. The video output is coupled to an 8-bit frame grabber board 22 capable of storing each frame imaged by the CCD camera, comprising 640×480 pixels per frame, for analysis by computer 24. The frame grabber board acquires an entire image in 1/30s, a capture rate that yields a flicker-free display on TV monitor 20.

Computer 24 may comprise an 80386-based desktop computer equipped with a math co-processor and a commercial software package (National Instruments Lab Window ®), for data collection and analysis. The software package provides a tool for developing a digital signal processing program (see Appendix A) to accomplish such tasks as base line correction to compensate for drift, digital filtering to remove undesirable noise components, fast Fourier and fast Hartley transform analysis, power spectrum measurements and calculating RHEED oscillations for both stationary and rotational substrates by calculating the maximum intensity of the diffraction pattern image per sub-frame.

A significant task in developing the video analysis system was to devise a method for extracting useful RHEED oscillation data from the video images captured by the frame grabber. Initially, it was hoped that identifying and then tracking the diffracted intensity patterns associated with a specified set of substrate azimuths would make it possible to collect the needed oscillation information from selected points on these patterns as they swept across the phosphor screen during substrate rotation. At normal rotation speeds, however, the intervals during which no identified pattern was present on the screen were too great to permit satisfactory analysis. Fortunately, tracking the region of diffracted intensity generated by the specular reflection of the electron beam from the substrate surface permitted useful RHEED oscillation information to be extracted from the video data.

To track the region of specular reflection three approaches were tried. A single-pixel tracking method failed because of the magnitude of the movement of the reflected beam due to nonplanar bonding of the substrate, wobble in the mechanical components of the azimuthal rotation apparatus, and instabilities in the electron gun. In addition, the spatial extent of the image of the reflected beam, together with the limited dynamic range of the frame grabber board 22, made evaluation of the peak intensity difficult. As a second approach, from the full video image, a rectangular subframe was selected that included the entire specular reflection, and the reflection was tracked by moving this subframe. However, the computational overhead required to analyze the intensity data associated with the large numbers of pixels contained in the subframe was so high that the processing rate dropped to about 5 frames/s. This rate was too low to yield enough data for accurately determining the oscillation frequency for growth at a normal rotation rate of 10 rpm. In the third approach, which was successful, a combination of 64 pixels in a single horizontal row and 64 pixels in a single intersecting vertical column was selected to track the region of specular reflection. With these two lines of pixels, the position of the peak intensity of the specular reflection could be accurately tracked.

Figure 7A:
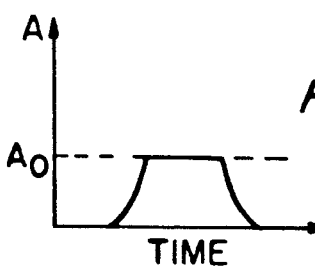
FIG. 7A is a plot of amplitude versus time of a given pixel intensity profile illustrating the clipping effect caused by limitations in dynamic range.
Figure 7B:
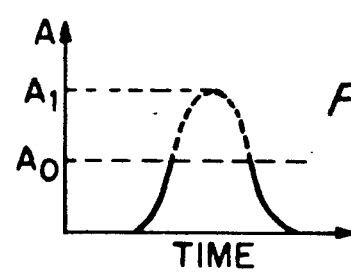
FIG. 7B is a plot as in FIG. 7A in which the true peak amplitude A1 is extracted assuming a Gaussian intensity profile.

Because of the limited dynamic range of the frame grabber board, it may sometimes be necessary to evaluate the peak intensity from data for lines of pixels of which one or more may have a saturated intensity value, as shown in FIG. 7A. This task may be accomplished by fitting the intensity profile to a Gaussian function and then estimating the peak intensity Al in the absence of saturation, as shown in FIG. 7B. With the combination of tracking and intensity analysis performed by the computer 24 under the direction of the program of Appendix A, video data may be processed at up to about 20 frames/s. This rate yields an uncertainty of approximately 1% in a growth rate of 1 $\mu$m/h.

Figure 8:
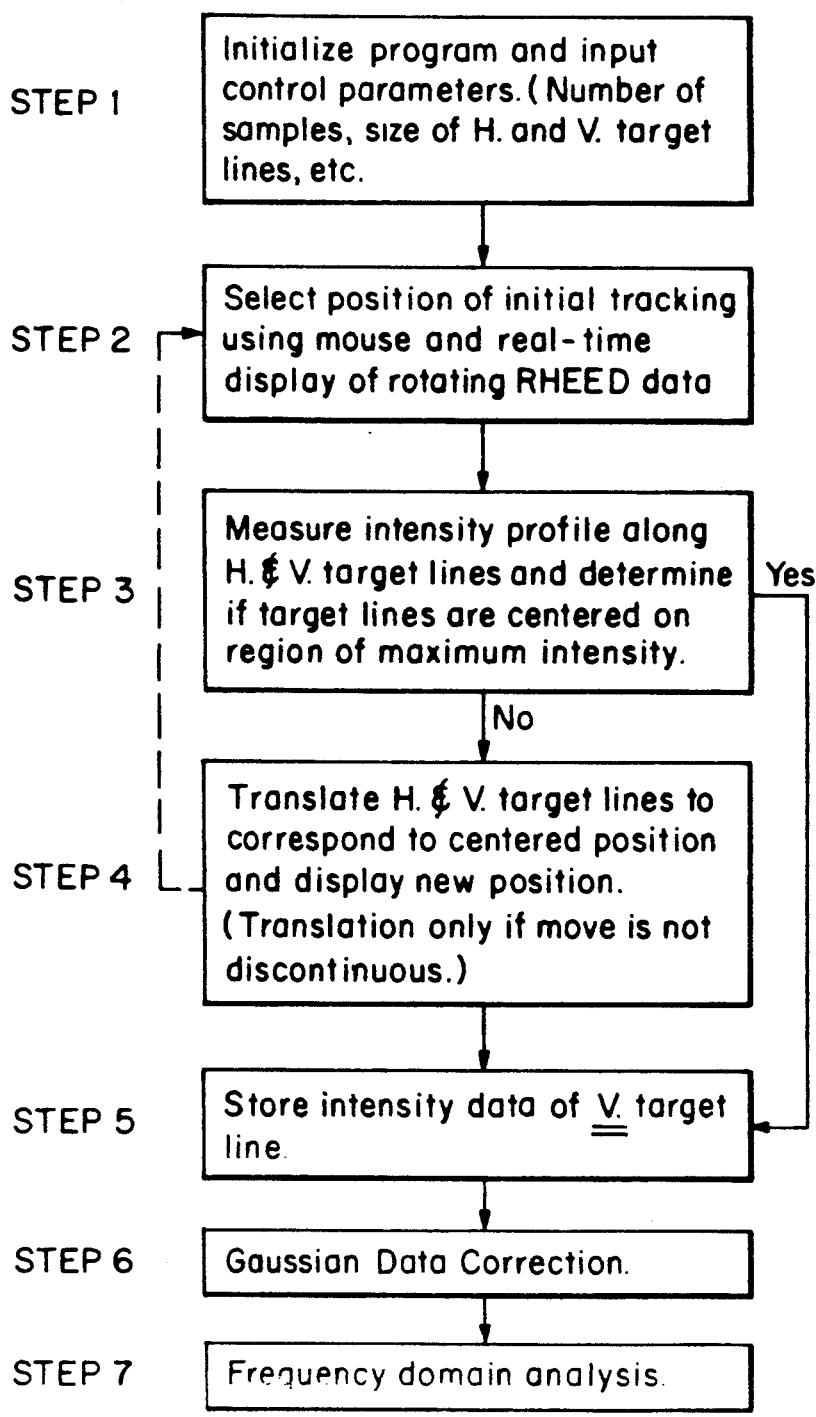
FIG. 8 is a flow chart of the program of Appendix A.

FIG. 8 is a flow chart of the main steps in the program of Appendix A. First, the computer is initialized and control parameters are inputted (STEP 1). A mouse is then used to select the position of initial tracking using a real-time display on the TV monitor of the rotating RHEED data (STEP 2). The intensity profile of the data is then measured along horizontal (H) and vertical (V) lines and a determination is made as to whether or not the V & H target lines are centered on the region of maximum intensity (STEP 3). If they are, the intensity data of the vertical target line is stored (STEP 5). If not, the H & V target lines are translated to correspond to the TV centered position and the new position (STEP 4) displayed and STEPS 2 and 3 repeated with the new position.

The vertical target line data stored in STEP 5 is corrected in accordance with a Gaussion curve, as necessary in STEP 6, and this data is subjected to frequency domain analysis as disclosed in the parent application referenced above (STEP 7).

The intensity data extracted from the video system is then processed and analyzed by means of frequency-domain techniques described in the parent application incorporated herein by reference. For the rotational RHEED data, it is also necessary to perform digital filtering to remove spurious frequency components. A relatively wide bandpass filter, with a ±20% frequency cutoff, was found to be adequate for this purpose. Analyzed growth data from the computer 24 is then coupled to reactor controls 28 to control various growth parameters, such as flux ratios of the III-V elements, rotation speed, temperature, etc.

Figure 2:
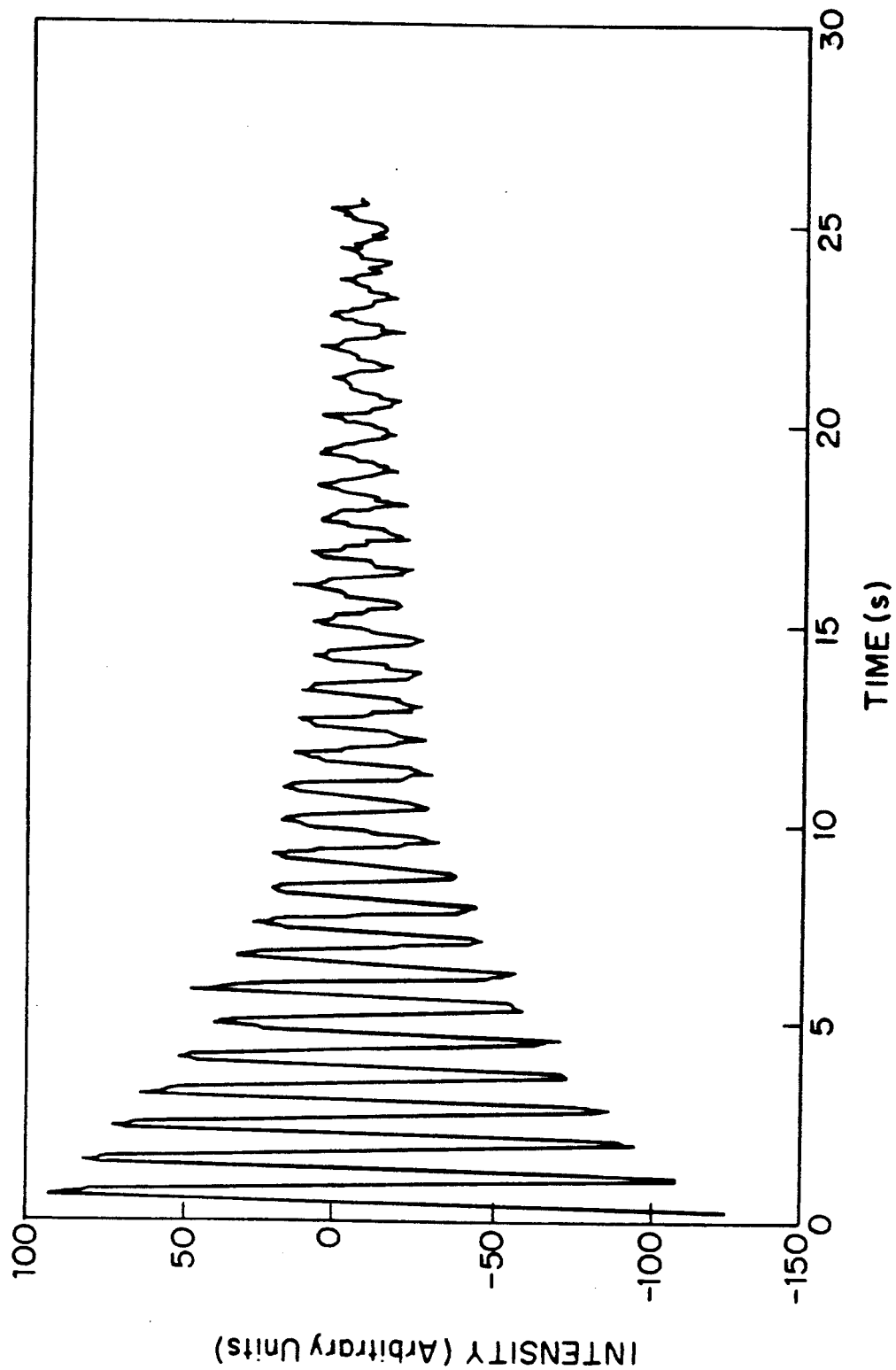
FIG. 2 is a plot of RHEED intensity versus time for a non-rotating sample.
Figure 3:
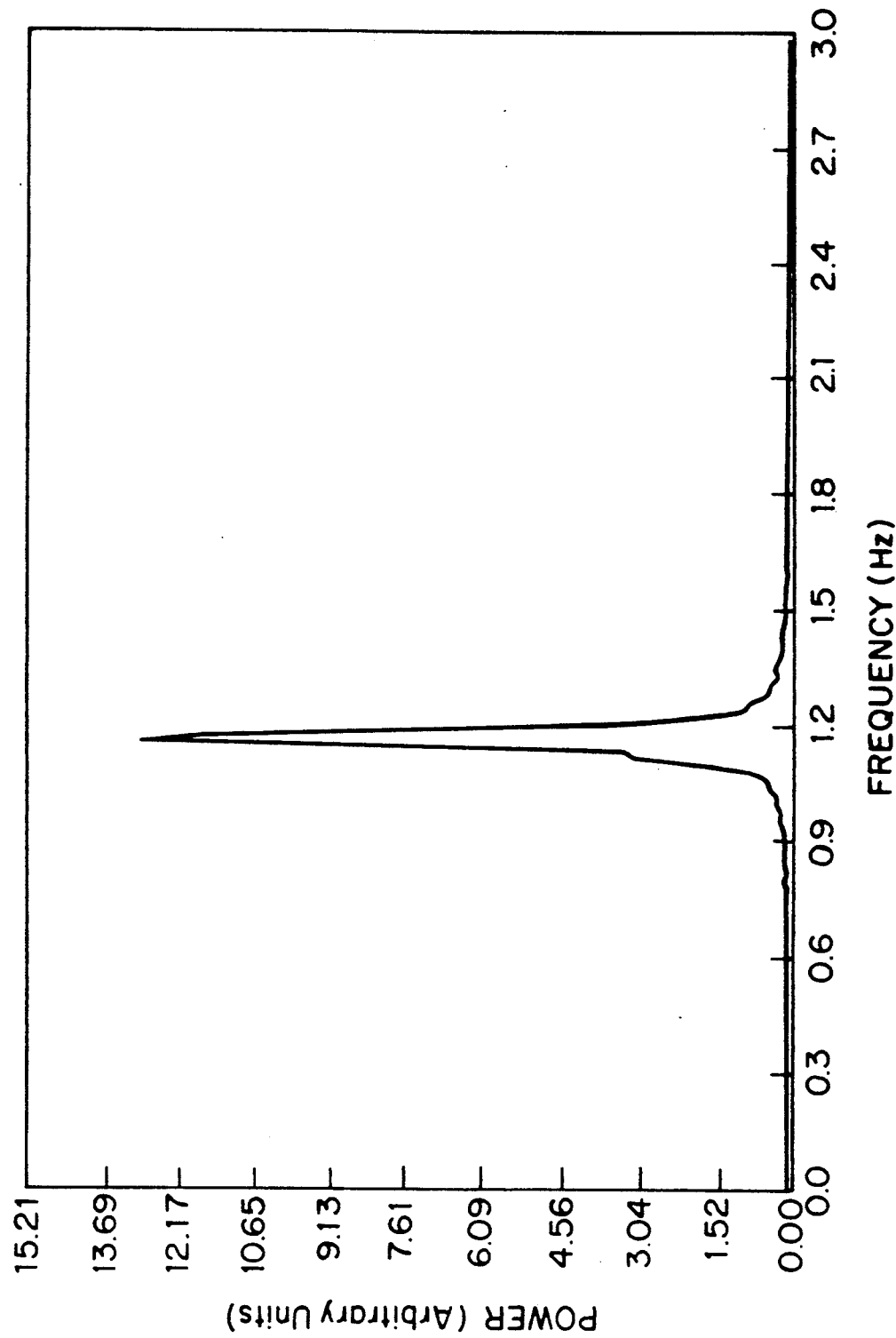
FIG. 3 is a plot of the power spectrum, i.e., power versus frequency of the RHEED data of the data from the sample of FIG. 2.
Figure 4:
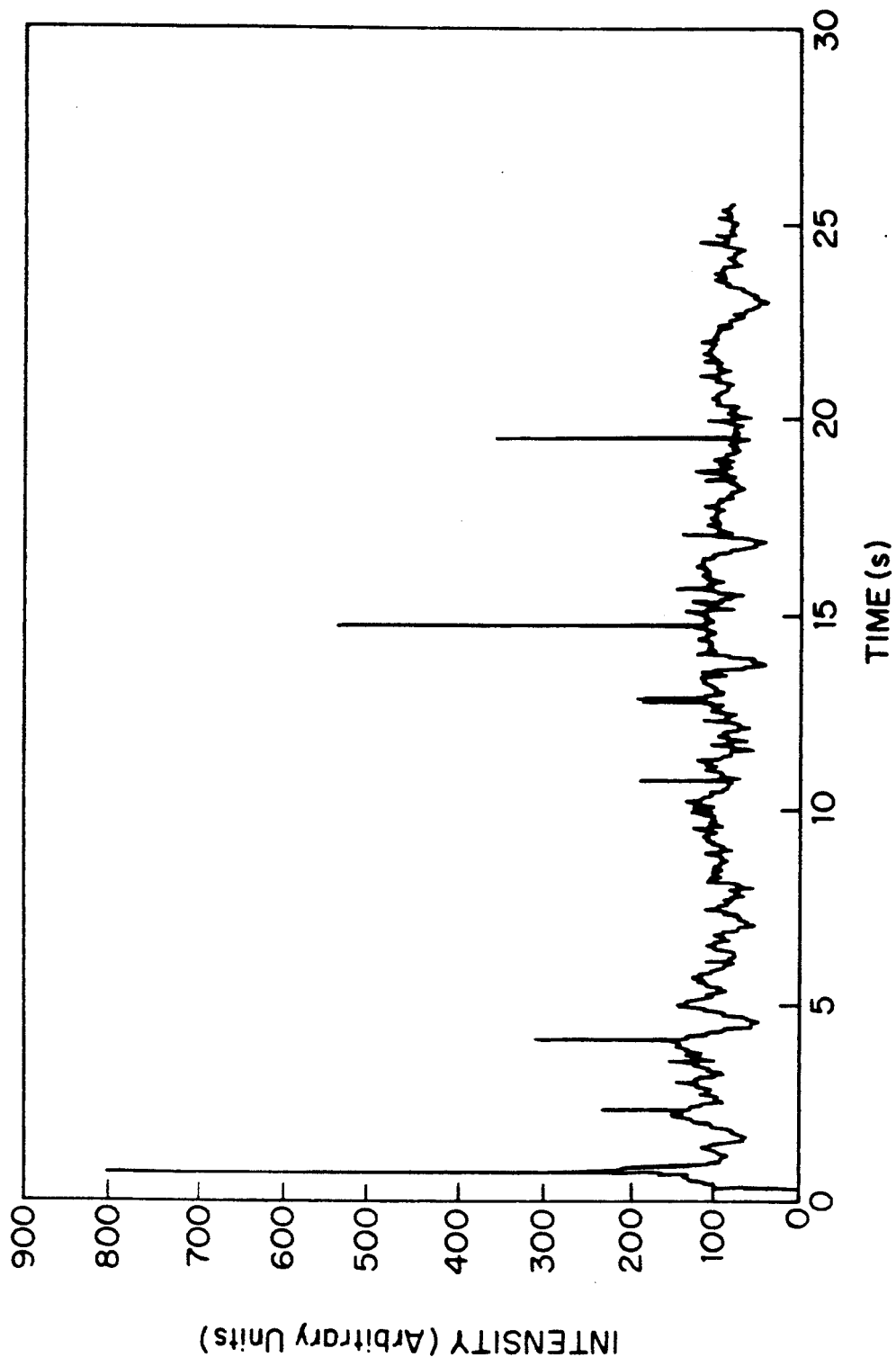
FIG. 4 is a plot of RHEED intensity versus time for a sample rotating at 5 rpm.
Figure 5:
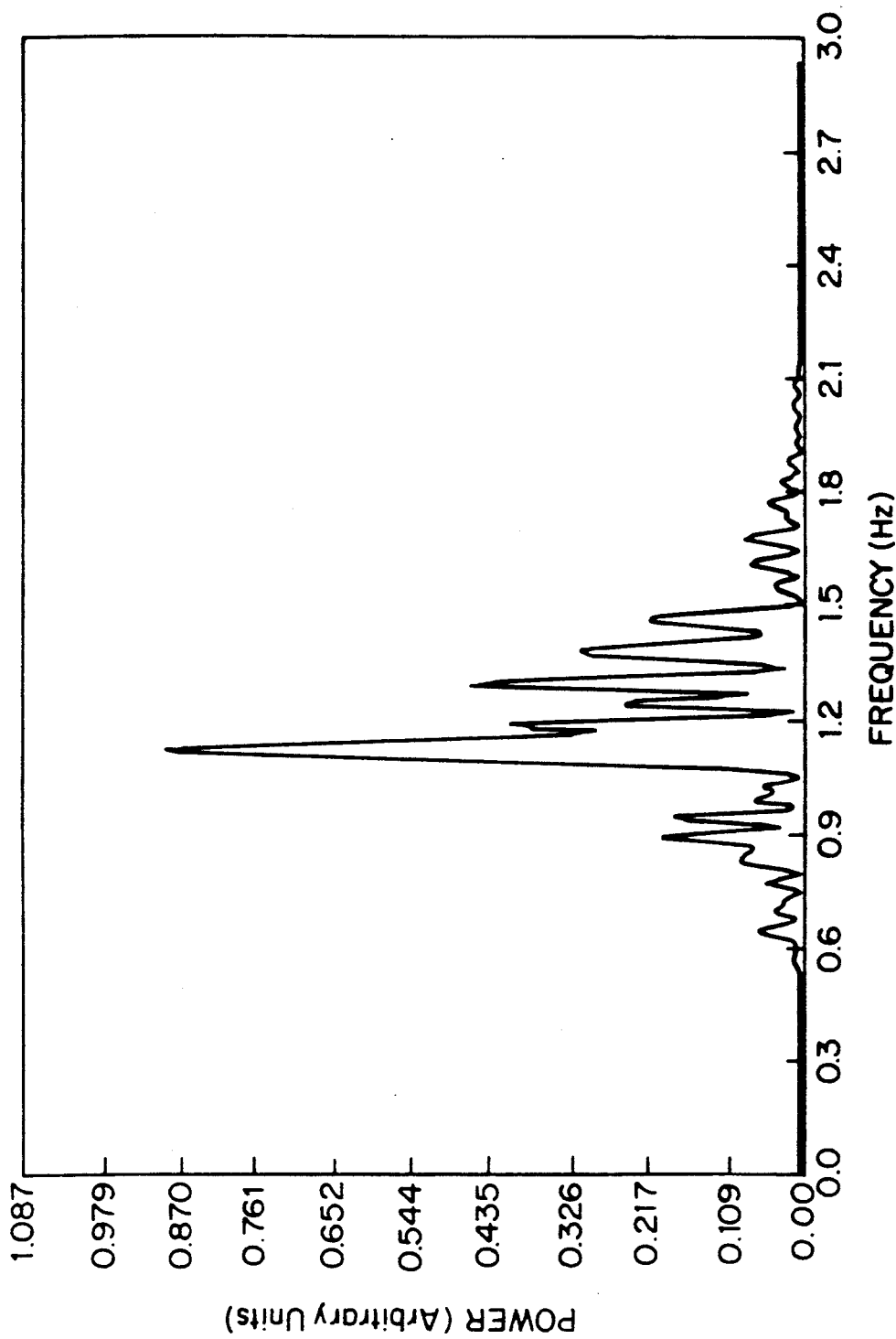
FIG. 5 is a plot of the power spectrum of the data from the sample of FIG. 4.
Figure 6:
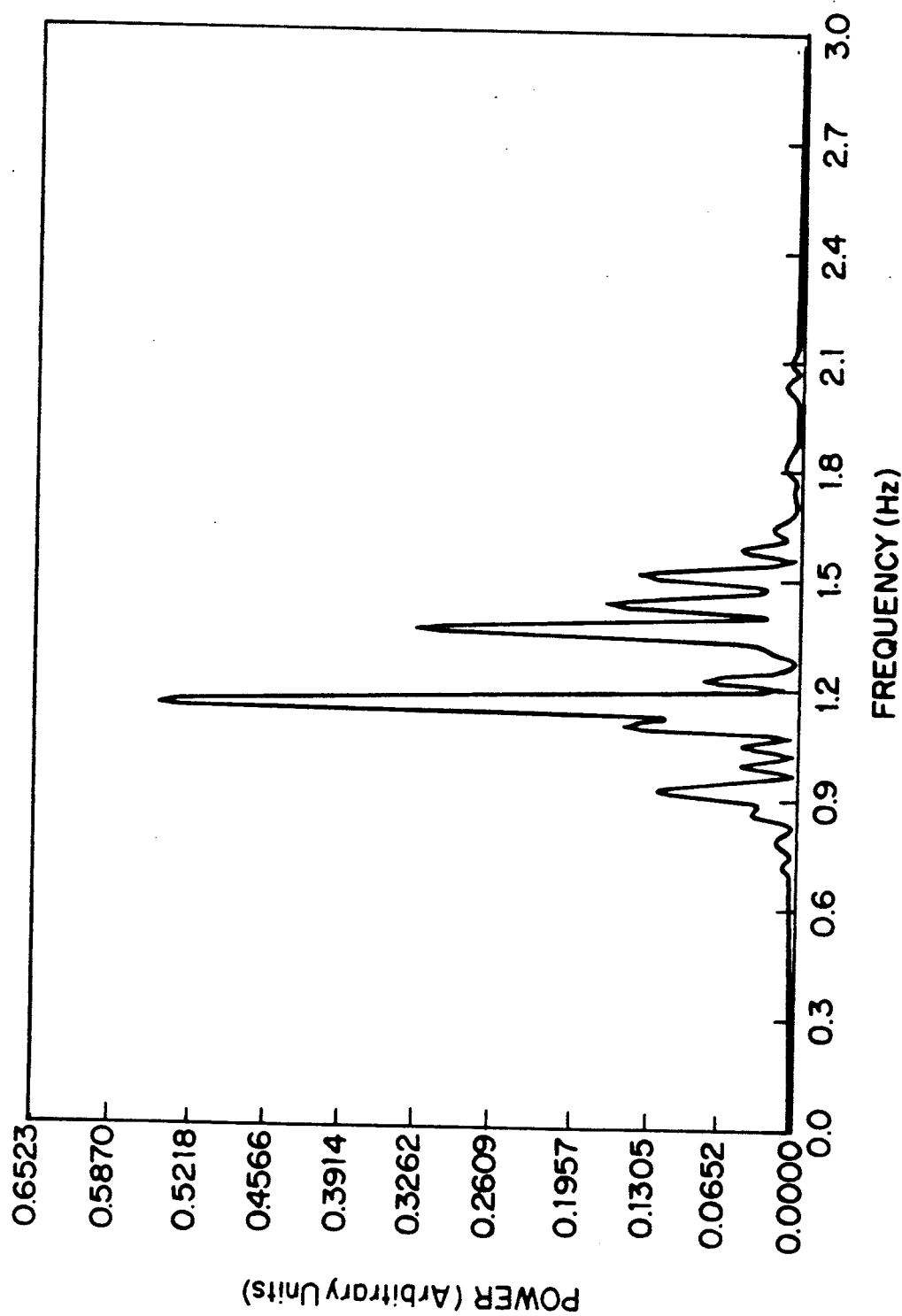
FIG. 6 is a plot of the power spectrum of data for the sample of FIG. 4 rotating at 10 rpm.

FIG. 2 shows the time-domain RHEED intensity data for a non-rotating GaAs sample obtained with the video tracking system operating at about 20 frames/s. There are 512 data points, corresponding to about 25 s of data acquisition. In this case, of course, the tracking was not necessary. FIG. 3 shows the power spectrum obtained by frequency-domain analysis of the data of FIG. 2, with a well-resolved peak at 1.17 Hz. FIG. 4 shows the time-domain data taken for the same sample, but with a substrate rotation rate of 5 rpm. No oscillatory behavior is apparent. FIG. 5 shows the power spectrum of the data from FIG. 4, with a peak at 1.15 Hz. FIG. 6 shows the power spectrum obtained by frequency-domain analysis of data taken for the same sample rotating at 10 rpm. For this case, a well-resolved central peak of 1.17 Hz is visible. Thus, for static, 5-rpm and 10-rpm experiments, the extracted RHEED oscillation frequencies agree to within 2%.

While we were to able extract RHEED oscillation data in experiments on GaAs samples rotating at rates above 10 rpm, the signal-to-noise ratio in the power spectrum was reduced. With faster hardware and improved software it is expected that well-resolved power spectra from data for samples rotating at rates approaching the current maximum of about 100 rpm may be obtained.

J. Zhang et al, *Appl. Phys.* A.42, 317 (1987) reported that the phase relationships of RHEED oscillations as a function of azimuthal angle for GaAs growth are quite complex because of the interaction of multiple scattering processes. It is surprising, therefore, that sufficient signal power of the fundamental oscillation frequency can be recovered to permit discrimination of this frequency from the other components that are present.

EQUIVALENTS

Those skilled in the art will know, or be able to ascertain using no more than routine experimentation, many equivalents to the specific embodiments of the invention described herein.

While the invention has been described in connection with RHEED oscillations, other applications are envisioned for this system. For example, any in situ method for generating an incident beam on a specimen during growth and detecting the resultant beam variations with time will benefit from the invention. Thus, light scattering, rather than diffraction phenomena, may be detected and used as the time domain data for determining growth oscillation. Photo-emissions or reflected beams may also generate detectable oscillations. The beam may comprise any suitable energy beam, such as an electron beam, photon beam, ion beam or X-ray beam.

All manner of growth chambers, including (PVD) or the like, are contemplated, as well as a wide variety of growth materials, such as superconductors, silicides and metal organic films of semiconductor material, without limitation.

These and all other equivalents are intended to be encompassed by the following claims.

APPENDIX A (C) Copyright Massachusetts Institute of Technology 1992

R.H.E.E.D Rotational Analysis Program

Written by Adrian J. Isles

```
*/ include <stdio.h>
include "c:\qc\dev_kit\pedefs53.h"
#include "c:\qc\dev_kit\peerrs53.h"
#include <graph.h>
#include <time.h>
#include <sys\types.h>
#include <sys\timeb.h>
#include <dos.h>
#include <float.h>
#include <math.h>

/* CONSTANT DEFINITIONS */ define EXTERNAL_SYNC 1
define INTERNAL_SYNC 0
#define SYNC_STATE EXTERNAL_SYNC
#define LINE_LENGTH 80
#define ERROR -1
#define MAX_CROSSHAIR_LENGTH 5
#define MAX_X 640
#define MAX_Y 480
#define MAX_SIDE_LENGTH MAX_X
#define TYPE_BYTE unsigned char
#define TRUE 1
#define FALSE 0
#define STEP 5
#define MAX_NUM_PTS 1000
#define DEFAULT_FILE_NAME  "untitled.dat"
#define INITIAL_X (int) MAX_X / 2
#define INITIAL_Y (int) MAX_Y / 2
#define SHADOW_INTENSITY 0xff
#define UP_ARROW     72
#define DOWN_ARROW   80
#define LEFT_ARROW   75
#define RIGHT_ARROW  77
#define QUIT    'q'
#define RESIZE  'r'
#define PLUS    '+'
```

```c
#define MINUS     '-'
#define CHANGE_COLOR ' '
#define BELL "\a"
#define POSITIVE(x) (x >= 0)
#define NEGATIVE(x) (x < 0)
#define LEFT_BUTTON_PRESSED(x) ((x) & 0x1)
#define RIGHT_BUTTON_PRESSED(x) ((x) & 0x02)
#define MOUSE_INTERRUPTS 0x33
#define GET_MOUSE_POSITION 3
#define GET_MOUSE_PHYSICAL_POSITION 11
#define MAX_STATIC_DATA_PTS MAX_NUM_PTS
#define X_LENGTH(z) (z->new_pos.top_right_coor.x-z->new_pos.top_left_coor.x)
#define Y_LENGTH(z) (z->new_pos.bot_right_coor.y-z->new_pos.top_right_coor.y)
#define MAX_AREA 5000
#define NEW_BOX_SIZE_Y(w,z) (X_LENGTH(w) * (Y_LENGTH(w) + 2*z))
#define NEW_BOX_SIZE_X(w,z) (X_LENGTH(w) + 2*z) * Y_LENGTH(w))
#define BOX_AREA(z) ( X_LENGTH(z) * Y_LENGTH(z) )
#define PIXEL_TYPE 0
#define SECONDS(x) ( (double) x.millitm/1000.0 + (double) x.time )
#define ONE_THIRD   ( (double) (1.0 / 10) )
#define TWO_THIRD   ( (double) (1.0) )
#define CROSSHAIR_BOTTOM(x)   x + MAX_CROSSHAIR_LENGTH
#define CENTER_X(z) z->new_pos.col_coor.x
#define CENTER_Y(z) z->new_pos.line_coor.y
#define START ' '
#define STOP ' '
#define DEFAULT_BOX_SIZE  100
#define WIN_TOP_X 100
#define WIN_TOP_Y 160
#define WIN_BOT_X MAX_X
#define WIN_BOT_Y 320
#define MAX_DYNAMIC_DATA_PTS  512
#define MAX_PTS_PER_FRAME 65
#define MAX_PIXEL_INTENSITY 0xff
#define SATURATED(x) (x==MAX_PIXEL_INTENSITY)
#define MEDIAN(array, n) (array[n] == array[n + 1])
#define SEG_LINE_LEN 400
#define SEG_COL_LEN   100
#define TOP_OF_COL_SEG(y) (y - SEG_COL_LEN/2)
#define TOP_OF_ROW_SEG(x) (x - SEG_LINE_LEN/2)
#define VALID_GUASSIAN_DATA(a, b, fa, fb)   ( (a < b) && (fa < fb) && (fa / fb
#define NOISE(new, old) (new > (old * 2.5))

/* DATA STRUCTURE DEFINITIONS */ typedef struct
    {
        int x;
        int y;
    } type_coordinate;

typedef struct
    {
        type_coordinate line_coor;
        type_coordinate col_coor;
    } type_crosshair_position;

typedef struct
    {
        type_coordinate top_left_coor;
        type_coordinate top_right_coor;
        type_coordinate bot_left_coor;
        type_coordinate bot_right_coor;
    } type_box_position;

typedef struct
    {
        type_crosshair_position new_pos;
        type_crosshair_position old_pos;
        TYPE_BYTE       line_hair[MAX_CROSSHAIR_LENGTH];
        TYPE_BYTE       col_hair[MAX_CROSSHAIR_LENGTH];
    } type_crosshair;
```

```
typedef struct
    {
        type_box_position old_pos;
        TYPE_BYTE       tr _side [MAX_SIDE_LENGTH];
        TYPE_BYTE       bot_side [MAX_SIDE_LENGTH];
        TYPE_BYTE       left_side [MAX_SIDE_LENGTH];
        TYPE_BYTE       right_side [MAX_SIDE_LENGTH];
    } type_box;

typedef enum
    {
        up, down, left, right
    } type_direction;

typedef int boolean;

/* FUNCTION PROTOTYPE DEFINITIONS */ int PE_OPEN(void);
    int PE_RESET(void);
    int PE_SET_SYNC(int);
    int PE_GET_LINE(int, int, int*, unsigned char[], int);
    int PE_GET_COLUMN(int, int, int*, unsigned char[], int);
    int PE_PUT_LINE(int, int, int*, unsigned char[], int);
    int PE_PUT_COLUMN(int, int, int*, unsigned char[], int);
    int PE_GET_RGN (int, int, int, int, int*, int*, unsigned char[], int);

void main (void);
    void InitializeFrameGrabber(void);
    void PrintTitleScreen(void);
    void PromptAndGetUserInput (int *num_of_pts, char filename[],
                                char discription[], boolean *tracking,
                                boolean *visual_tracking);
    FILE *OpenFile(char filename[]);
    void SelectStaticPixels(type_crosshair *crosshair, type_box *box);
    void InitializeBox(type_box *box);
    void InitializeCrosshair(type_crosshair *shadow);
    void InitializeArray(TYPE_BYTE in_array[], int num_elements);
    void GetImage(void);
    int KeyPressed(void);
    void GetAndProcessKeyboardInput (type_crosshair *crosshair, type_box *box,
                                int *increment, boolean *resize,
                                boolean *end, boolean *change_color );
    void GetAndProcessMouseInput (type_crosshair *crosshair, type_box *box,
                                boolean *resize, boolean *end);
    void MoveCrosshairAndBox (type_crosshair *crosshair, type_box *box,
                                type_direction direction, boolean resize,
                                int increment);
    void ResizeUp (type_box *box, int increment, int max_area);
    void ResizeDown (type_box *box, int increment);
    void ResizeRight (type_box *box, int increment);
    void ResizeLeft (type_box *box, int increment, int max_area);
    void ShiftRight (type_crosshair *crosshair, type_box *box, int increment);
    void ShiftLeft (type_crosshair *crosshair, type_box *box, int increment);
    void ShiftDown (type_crosshair *crosshair, type_box *box, int increment);
    void ShiftUp (type_crosshair *crosshair, type_box *box, int increment);
    void PutCrosshairsAndBoxOnScreen (type_crosshair *crosshair, type_box *box
                                boolean *change_color);
    void NotBox(type_box *box);
    void NotCrosshair(type_crosshair *shadow);
    void SaveNewScreen (type_crosshair *crosshair, type_box *box);
    void SaveNewCrosshair(type_crosshair *crosshair);
    void SaveNewBox(type_box *box);
    void PrintNewScreen (type_crosshair *crosshair, type_box *box);
    void PrintNewCrosshair(type_crosshair *crosshair);
    void PrintNewBox (type_box *box);
                                double data[], int *num_pt  boolean visual_trackin
                                double *elapsed_time);
    double AverageBoxIntensity (type_crosshair *crosshair, type_box *box);
    void SaveData (FILE *file_ptr, char *discription, double data[],
                int num_of_pts, double time);
    void PlotData(double data[], int number_of_pts, double max);
```

```
   double MaxIntensity (double data[], int num_of_pts);
   void PlotIntensityVsTime (double data[], char discription[],
                             int num_of_pts, double elapsed_time);
   void NotArray (TYPE_BYTE in_array[], int num_elements);
   void ClearScreen (void);
   void PrintStaticInstructions (void);
   void CreateTrackingBox (type_box *box);
   void SelectDynamicPixels(type_crosshair *crosshair, type_box *box);
   void PrintDynamicInstructions(void);
   void SearchForSpot (type_coordinate *new_pos);
   void FindMaxXPosition (TYPE_BYTE line[], int *x, int num_of_pts);
   void FindMaxYPosition (TYPE_BYTE col[], int *y, int num_of_pts);
   void FindMidAndBreakPoint (int *mid_point, int *break_point,
                              TYPE_BYTE data[]);
   void CalculatePeakIntensities (TYPE_BYTE dynamic_data[MAX_DYNAMIC_DATA_PTS
                                  double data[], int num_of_pts);
   void CollectDynamicData(type_crosshair *crosshair, type_box *box,
                           double data[],int *num_pts, boolean visual_trackin
                           double *elapsed_time);
   int cmpgle ( double *elem1, double *elem2 );
   double Average (double array[], int num_of_pts);
   double FstNonZeroPt(TYPE_BYTE array[]);

/* LARGE ARRAY DECLARATIONS */ type_crosshair crosshair;
type_box       box;
double         RHEED_data[MAX_STATIC_DATA_PTS];
TYPE_BYTE      dynamic_data[MAX_DYNAMIC_DATA_PTS][MAX_PTS_PER_FRAME];
/* use dynamic_data as local to CollectDynamicData Only!! */
TYPE_BYTE      vertical[MAX_PTS_PER_FRAME];

void main (void)
/*
Precondition  : The Quick Capture board DT2953 is installed and the
                Developer's Kit device driver is loaded.  The video
                input into the Frame Grabber board should contain
                RHEED (Reflection High Energy Electron Diffraction) data.
                The RHEED diffaction pattern should be centered on the
                middle of the screen.
Action        : This program will calculate RHEED oscillations for both
                stationary and rotational substrates.  The program will
                calculate the maximum intensity of the diffraction pattern
                on the screen.  If the maximum intensity of the diffraction
                pattern is greater maximum possible intensity of the
                frame grabber, the program will approximate the maximum
                intensity.
Postcondition : The output to this program will be the intensity data
                written to a file.
*/

{
   int num_of_pts;
   char filename [LINE_LENGTH];
   char discription [LINE_LENGTH];
   boolean tracking;
   FILE *file_pointer;
   double elapsed_time;

InitializeFrameGrabber();
   PrintTitleScreen();
   PromptAndGetUserInput (&num_of_pts, filename, discription, &tracking,
                          &visual_tracking);
   file_pointer = OpenFile(filename);

if (tracking)
   {
      SelectDynamicPixels(&crosshair, &box);
      CollectDynamicData(&crosshair, &box, RHEED_data, &num_of_pts,
                         visual_tracking, &elapsed_time);
```

```
            SaveData(file_pointer, discription, RHEED_data, num_of_pts,
                    elapsed_time);
            PlotIntensityVsTime(RHEED_data, discription, num_of_pts,
                            elapsed_time);
        }
    else
        {
            SelectStaticPixels(&crosshair, &box);
            CollectStaticData(&crosshair, &box, RHEED_data, &num_of_pts,
                        visual_tracking, &elapsed_time);
            SaveData(file_pointer, discription, RHEED_data, num_of_pts,
                    elapsed_time);
            PlotIntensityVsTime(RHEED_data, discription, num_of_pts,
                            elapsed_time);
        } close (file_pointer);
    _setvideomode(_DEFAULTMODE);
    printf("END OF PROGRAM.\n");
}

/******************************************************************/ void SearchForSpot (type_coordinate *new_pos)

/*
Precondition   :  new_pos is passed into this function. *new_pos contains
                  the last known position of the electron diffraction data
                  of intrest.
Action         :  This function locates the electron diffraction data on the
                  screen assuming the center is the spot of maximum intensity.
                  This function finds the center of maximum intensity by
                  looking at a vertical segment of pixel that goes
                  throught the center of the old diffraction data. It
                  then finds the row of maximum intensity on that column
                  and then looks at that row segment for the column of
                  maximum intensity.  That position will then become the
                  new center of the electon diffraction data.
Postcondition  :  *new_pos will be passed out of this function containing the
                  the new position of the electron diffraction data.
*/

{
    static TYPE_BYTE line[SEG_LINE_LEN];
    static TYPE_BYTE col[SEG_COL_LEN];
    static int search_win_x=0;
    static int search_win_y=0;
    static int requested_pixels;
        { search_win_x = TOP_OF_ROW_SEG(new_pos->x);
            search_win_y = TOP_OF_COL_SEG(new_pos->y);
        } requested_pixels = SEG_COL_LEN;
    PE_GET_COLUMN(search_win_y, new_pos->x, &requested_pixels,
                col, PIXEL_TYPE);
    FindMaxYPosition ( col, &(new_pos->y), SEG_COL_LEN);
    new_pos->y = search_win_y + new_pos->y;
    requested_pixels = SEG_LINE_LEN;
    PE_GET_LINE (new_pos->y, search_win_x, &requested_pixels,
                line, PIXEL_TYPE);
    FindMaxXPosition ( line, &(new_pos->x), SEG_LINE_LEN);
    new_pos->x = search_win_x + new_pos->x;
}

/******************************************************************/ void FindMaxXPosition (TYPE_BYTE line[],
                       int       *x,
                       int       num_of_pts)
/*
```

```
Precondition    :  line, *x, and num_of_pts are all passed into this function.
                   line contains a column of electron diffraction, num_of_pts
                   contains the size of line, and the value of *x as it is
                   passed into this function is irrevelent.
Action          :  This function finds the element in line and set the position
                   of that element equal to *x.  If there is more than one
                   value of maximum intensity, the maximum value will be the
                   median location of those values.
Postcondition   :  *x will be passed out of this function containing the
                   postion of maximum intensity.
*/

{
    int counter=0;
    TYPE_BYTE max_intensity=0;
    TYPE_BYTE buffer_max=0;
    int max_col=0;
    int median_start=0;
    int buffer_length=0;
    int median_length = 0;

num_of_pts--;
    for (counter=0; counter < num_of_pts; counter++)
        {
            if (line[counter] >= max_intensity)
            { median_start = counter;
                while ( (counter < num_of_pts) && MEDIAN(line, counter) )
                    {
                        counter++;
                    } buffer_length = counter - median_start;

if ( buffer_length > median_length &&
                     SATURATED(line[median_start]) )
                    {
                        median length = buffer length;
                        max_ .tensity = MAX_PIXEL_INTEN TY;
                    }
                else
                    {
                        if (!median_length)
                            {
                                max_col = median_start;
                                max_intensity = line[max_col];
                            }
                    }
            }
        }
        *x = max_col;
}

/************************************************************************/ void FindMaxYPosition (TYPE_BYTE col[],
                       int       *y,
                       int       num_of_pts)
/*
Precondition    :  col, *y, and num_of_pts are all passed into this function.
                   line contains a column of electron diffraction, num_of_pts
                   contains the size of col, and the value of *y as it is
                   passed into this function is irrevelent.
Action          :  This function finds the element in col and set the position
                   of that element equal to *y.  If there is more than one
                   value of maximum intensity, the maximum value will be the
                   median location of those values.
Postcondition   :  *y will be passed out of this function containing the
                   position of maximum intensity.
*/
```

```
{
    int counter;
    TYPE_BYTE max_intensity=0;
    TYPE_BYTE buffer_max=0;
    int max_row;
    int median_start=0;
    int buffer_length=0;
    int median_length = 0;

num_of_pts--;
    for (counter=0; counter < num_of_pts; counter++)
    {
        if (col[counter] >= max_intensity)
        {
            median_start = counter;
            while ( (counter < num_of_pts) && MEDIAN(col, counter) )
            {
                counter++;
            } buffer_length = counter - median_start;

if ( buffer_length > median_length &&
                 SATURATED(col[median_start]) )
            {
                median_length = buffer_length;
                max_row = counter - buffer_length / 2;
                max_intensity = MAX PIXEL INTENSITY;
            else
            {
                if (!median_length)
                {
                    max_row = median_start;
                    max_intensity = col[max_row];
                }
            }
        }
    }
    *y = max_row;
}

/*******************************************************************/ void CollectDynamicData(
                type_crosshair  *crosshair,
                type_box        *box,
                double          data[],
                int             *num_pts,
                boolean         visual_tracking,
                double          *elapsed_time
                )
```

/*
Precondition  : *crosshair, *box, data, *num_pts, visual_tracking, and
                *elapsed_time, are all passed into this function. *crosshair
                contains the initial position of the electron diffraction
                data. The value of *box & data as it enters this function is
                irrevelent. *num_pts contins the number of data points that
                should be sampled. visual_tracking is a boolean value that
                determines if a tracking symbol should be displayed on the
                screen in real time. Finally the value of *elapsed_time as
                it enters this function is irrevelent.
Action        : This function collect rotational RHEED data. The function
                finds the maximum intensity of each frame using the Guassian
                approximation method. Each peak intensity is stored in the
                data variable. If visual_tracking is set to true this
                function will display a vertical line segment representing
                the location of the electron diffraction data of intreset.
                *elapsed_time will contain the time it took for this function
                to collect the electon diffraction data. If the user hits
                any key during data aquisition, data aquisition will stop.

Postcondition : data and *num_pts will be passed out of this function. data
will the peak intensitis of the electon diffraction data, and
num_pts will contian the number of points taken.
*/

```
{
  int counter;
  char trash_char;
  struct timeb start_time;
  struct timeb end_time;
  type_coordinate spot_position;
  int requested_pixels;

/* the array dynamic_data is conridered local to this function all though
     it is declared locally.*/

ClearScreen();
  printf("\n\n\n\n PRESS <RETURN> TO START RECORDING DYNAMIC RHEED DATA");
  trash_char = getchar();
  printf("\n\n\n\n RECORDING DATA");
  spot_position.x = crosshair->new_pos.col_coor.x;
  spot_position.y = crosshair->new_pos.line_coor.y;
  InitializeArray(vertical, MAX_PTS_PER_FRAME);  /* DEBUG */
  if (visual_tracking)
      {
      ftime (&start_time);
      for (counter=0; counter < *num_pts; counter++)
          {
          GetImage();
          SearchForSpot(&spot_position);
          requested_pixels = MAX_PTS_PER_FRAME;
          PE_GET_COLUMN(spot_position.y - MAX_PTS_PER_FRAME/2,
                        spot_position.x,&requested_pixels,
                        dynamic_data[counter], PIXEL_TYPE);
          PE_PUT_COLUMN(spot_position.y - MAX_PTS_PER_FRAME/2,
                        spot_position.x,&requested_pixels,
                        vertical, PIXEL_TYPE);
          if (kbhit())
              {
              break;
              }
          }
      ftime (&end_time);
      }
  else
      {
      ftime (&start_time);
      for (counter=0; counter < *num_pts; counter++)
          {
          GetImage();
          SearchForSpot(&spot_position);
          requested_pixels = MAX_PTS_PER_FRAME;
          PE_GET_COLUMN(spot_position.y - MAX_PTS_PER_FRAME/2,
                        spot_position.x,&requested_pixels,
                        dynamic_data[counter], PIXEL_TYPE);
          if (kbhit())
              {
              break;
              }
          }
      ftime (&end_time);
      }
  *num_pts = counter;
  *elapsed_time = SECONDS(end_time) - SECONDS(start_time);
  ClearScreen();
  printf("\n\nData aquisition has ended.\n");
  CalculatePeakIntensities(dynamic_data, data, counter);
}
```

/*************************************************************************/

```
void CalculatePeakIntensities (TYPE_BYTE dynamic_data[][MAX_PTS_PER_FRAME],
                               double data[],
                               int num_of_pts)

/*
Precondition  : dynamic_data, data, and num_of_pts, are all passed in
                function. dynamic_data is a two dimensional array that
                contains a vertical line of electron diffraction data for
                each frame. num_of_pts contian the number of frames of
                intrest. The value of data as it is passed into this
                function is irrevelent.
                determin_ the peak intesity of the  ectron diffraction
                data when that peak intesity is abo._ the maximum intensity
                of the frame grabber. The maximum intensity for each point
                that is determined will be stored into data.
Postcondition : data will be passed out of this function containing the
                maximum pixel intensity for each frame.
*/

{
    int counter;
    int frame_counter;
    int mid_point;
    int break_point;
    int  a;
    int  b;
    double f_of_a;
    double f_of_b;
    double h_squared;
    double amplitude;
    double guass[20];
    double c;
    double d;
    double average;

data[0] = 0;

printf("\nCalculating Gaussian Amplitudes");

for (frame_counter=1; frame_counter < num_of_pts; frame_counter++)
    {
        printf(".");
        FindMidAndBreakPoint(&mid_point, &break_point,
                             dynamic_data[frame_counter]);

if (dynamic_data[frame_counter][mid_point] < MAX_PIXEL_INTENSITY)
        {
            data[frame_counter] =
                dynamic_data[frame_counter][mid_point];
        }
        else
        {
            counter = 0;
            for (a =   (int) ( (double) 0.33333 * (double) break_point),
                 b =   (int) ( (double) 0.66666 * (double) break_point);
                 (a < b) ; a++, b--)
            {
                f_of_a = (double) dynamic_data[frame_counter][(int) a];
                f_of_b = (double) dynamic_data[frame_counter][(int) b];

if ( VALID_GUASSIAN_DATA(a, b, f_of_a, f_of_b) )
                {
                    c = ((double)b - (double)mid_point);
                    d = ((double)a - (double)mid_point);
                    h_squared = log(f_of_a/f_of_b) / (c*c - d*d);
                    guass[counter] = f_of_a/exp(-1*h_squared*d*d);
                    counter++;
                }
            }
```

```
                qsort ((void *) guass, (size_t) counter, sizeof(double),
                    cmpgle);
                average = Average (guass, counter);
                    {
                        data[frame_counter] = average;
                    }
                else
                    {
                        if ( average < (2.5 * data[frame_counter-1]) )
                            {
                                data[frame_counter] = average;
                            }
                        else
                            {
                                data[frame_counter] = data[frame_counter-1];
                            }
                    }
            }
        }
    printf("DONE.\n");
}

/****************************************************************/ double FstNonZeroPt(TYPE_BYTE array[])

/*
Precondition  : array is passed into this function.
Action        : This function finds the first non zero element in the array
                array.
Postcondition : The position of the first non zero point is passed out of
                this function.
*/

{
    int counter=0;

while (!array[counter])
        {
            counter++;
        }
    return ((double) counter);
}

/****************************************************************/ double Average (double array[],
                int    num_of_pts)

/*
Precondition  : array and num_of_pts are passed into this function.
                num_of_pts contains the number of elements in array.
Action        : This function returns the average value of the elements
                in array.
Postcondition : The average value is passed out of this function.
*/ int counter;
    double sum=0;

if (num_of_pts > 2)
        {
            for (counter =0; counter < num_of_pts-1; counter++)
                {
                }
            return ( sum / (double) num_of_pts );
        }
    else
        {
            return (array[0]);
        }
}
```

```c
/****************************************************************/ int cmpgle( double *elem1, double *elem2 )

/*
Precondition  : elem1 and elem2 are passed into this function.
Action        : This function will return a 1 if *elem1 > *elem2 a -1 if
                *elem1 < *elem2, and a 0 otherwise/.
Postconditon  : the comparison value is returned.
*/
{
    if( *elem1 > *elem2 )
        return 1;
    else if( *elem1 < *elem2 )
        return -1;
    else
        return 0;
}

/****************************************************************/ void FindMidAndBreakPoint (int *mid_point,
                           int *break_point,
                           TYPE_BYTE col[])
/*
Precondition  :   mid_point, break_point, and col are all passed into this
                  function.  The value of mid_point and break_point are
                  irrevelent as they are passed into this function.
                  col contains a vertical line segment of electron diffraction
                  data.
Action        :   This function determines the point of maximum intensity, eth
                  actual or approximated and the point at which the electron
                  diffraction begins to saturate.
Postcondition :   *mid_point and *break_point will both be passed out of this
                  function.  *mid_point will contain the point of max
                  intensity.  *break_point will contain the point at which
                  the electron diffraction data begins to saturate.
*/

{
   int counter;
   TYPE_BYTE max_intensity=0;
   TYPE_BYTE buffer_max=0;
   int max_row;
   int median_start=0;
   int buffer_length=0;
   int median_length = 0;
   int max_median_start=0;

for (counter=0; counter < MAX_PTS_PER_FRAME-1; counter++)
      {
         if (col[counter] >= max_intensity)
            median_start = counter;
            while ( (counter < MAX_PTS_PER_FRAME) && MEDIAN(col, counter)
               {
                  counter++;
               } buffer_length = counter - median_start;

if ( buffer_length > median_length &&
                 SATURATED(col[median_start]) )
               {
                  median_length = buffer_length;
                  max_row = counter - buffer_length / 2;
                  max_median_start = median_start;
                  max_intensity = MAX_PIXEL_INTENSITY;
               }
            else
               {
```

```
                if (!median_length)
                    {
                        max_row = median_start;
                        max_intensity = col[max_row];
                    }
            }
        }
    }
    if (median_length)
        {
            *mid_point = max_row;
            *break_point = max_median_start;
        }
    else
        {
            *mid_point = *break_point = max_row;
        }
}

/***************************************************************/
void SelectDynamicPixels(
                        type_crosshair *crosshair,
                        type_box       *box
                        )

/*
Precondition  :  crosshair and box are both passed into this function.  The
                 value of both crosshair and box as they are passed into this
                 function are irrevelent.
Action        :  This function allows the user to chose the initial
                 defraction data position on the screen through the use
                 of the crosshair and box on the screen. The user can ethier
                 use the keyboard or mouse to control the crosshair and
                 box.
Postcondition :  crosshair and box are passed out of this function containinc
                 the initial position of the electron diffraction data.
*/

{
    boolean end = FALSE;
    boolean resize = FALSE;
    boolean change_color = FALSE;
    int increment = 1;
    InitializeCrosshair(crosshair);
    InitializeBox(box);
    PrintDynamicInstructions ();

while (!end)
        {
            GetImage();
            PutCrosshairsAndBoxOnScreen(crosshair, box, &change_color);
            GetAndProcessMouseInput(crosshair, box, &resize, &end);
            GetAndProcessKeyboardInput(crosshair, box, &increment, &resize,
                                       &end, &change_color);
        }
}

/***************************************************************/ void PrintDynamicInstructions ()

/*
Precondition  :  none.
Action        :  This function prints on the screen the instructions needed
                 to select a rotational RHEED diffraction pattern on the
                 screen.
Postcondition :  none.
*/

{
    ClearScreen();
    printf("\n\n");
```

```
        printf("              USE THE MOUSE OR KEYBOARD TO SELECT DIFFRATION PATTERN
        printf("\n\n          KEY                                   COMMAND\n"
        printf("             ===                                   ======\n");
        printf("\n");
        printf("         <SPACE BAR>                              CHANGE CROSSHAIR
        printf("              q                                   QUIT SELECTION MO
        printf("              +                                   INCREASE CURSOR S
        printf("              -                                   DECREASE CURSOR S
        printf("         <UP ARROW>                               MOVE CURSOR UP \n
        printf("         <DOWN ARROW>                             MOVE CURSOR DOWN
        printf("         <LEFT ARROW>                             MOVE CURSOR LEFT
        printf("         <RIGHT ARROW>                            MOVE CURSOR RIGHT
        printf("            MOUSE                                 MOVE CURSOR \n");
        printf("       LEFT MOUSE BUTTON                          QUIT SELECTION MO
        printf("\n\n          PLEASE LOCATE PATTERN AS CLOSE TO CENTER OF SCREEN A
}

/*****************************************************************************/ void PlotIntensityVsTime (double data[],
                          char   discription[],
                          int    num_of_pts,
                          double elapsed_time)

/*
Precondition  :  data, discription, num_of_pts, and elapsed_time are all
                 passed into this function. data contian the point to
                 be plotted. Discription is a character field containing
                 a discription of the data to be plotted. num_of_pts
                 contains the number of points to be plotted, and
                 elapsed_time is the total time needed to aquire all the data
Action        :  This function plot on the screen the RHEED data aquired by
                 this program.
*/

{
    double max;
    char buffer[LINE_LENGTH];
    char ch;

if ( _setvideomode(_VRES16COLOR) )
        {
        max = MaxIntensity (data, num_of_pts);
        sprintf(buffer, "                    P L O T  O F  I N T E N S I T Y  V
        printf(buffer);
        printf("\n\n\n %s \n\n\n",discription);
        printf("\n\n\n\n\n\nAverage\n");
        printf("Intensity\n");
        PlotData(data, num_of_pts, max);
        printf("\n\n\n\n\n\n         Time\n\n");
        printf("Maximum Intensity                      = %f\n", max);
        printf("Elapsed time (seconds)                 = %f\n", elapsed_time);
        printf("Number of Points Sampled               = %d\n", num_of_pts);
        printf("Averate Sample Rate (samples/sec)      = %f\n", (num_of_pts/elaps
        }
    else
        {
        printf("CANNOT OPEN SCREEN");
        }
    printf("\nPress <RETURN> to continue.");
    ch = getchar();
}

/*****************************************************************************/ double MaxIntensity (
                    double data[],
                    int    num_of_pts
                    )

/*
Precondition  : data and num_of_pts are passed into this function.
                num_of_pts contains the number of elements in data.
```

Action          : This function finds the maximum value in data.
Postcondition   : The maximum value of data is passed out of this function.
*/

```
{
    int counter;
    double max = 0;

for (counter=0; counter < num_of_pts; counter++)
        {
            if (data[counter] > max)
                {
                    max = data[counter];
                }
        }
    return (max);
}
```

/****************************************************************/

```
void PlotData(double data[],
              int    number_of_pts,
              double max)
```
/*
Precondition  : data, number_of_pts, and max are all passed into this
                function. data is an array that contains the points to
                be plotted. number_of_pts contains the number of elements
                in data, and max contains the maximum value in data. The
                screen must be in graphics mode.
Action        : This function plots on the screen the data contained in
                the array data.
Postcondition : none.
*/

```
{
    int counter;

_setcolor (5);
    _setviewport( WIN_TOP_X, WIN_TOP_Y, WIN_BOT_X, WIN_BOT_Y);
    _setwindow(TRUE, 0, 0, number_of_pts, max);
    _rectangle_w(_GBORDER,0, 0, number_of_pts, max);
    _setviewport (WIN_TOP_X - 1, WIN_TOP_Y - 1, WIN_BOT_X - 1, WIN_BOT_Y - 1);

_setwindow(TRUE, 0, 0, number_of_pts, max);
    _setcolor (20);
    _moveto_w(0,0);
    for (counter=1; counter < number_of_pts; counter++)
        {
            _setcolor(20);
            _setpixel_w(counter, data[counter]);
            _setcolor(10);
            _lineto_w(counter-1, data[counter-1]);
        }
}
```

/****************************************************************/

```
void SaveData (
               FILE *file_ptr,
               char *discription,
               double data[],
               int num_of_pts,
               double time
               )
```

/*
Precondition  : file_ptr, discription, data, num_of_pts, and time are all
                passed into this function. file_ptr points to a file that
                is open for writing. discription is an array of
                characters that is to be written in the discription field of
                the file. data contain the data to be written to the file.
                num_of_pts contain the number of elements in data, and time

```
                    contian the elapsed time in seconds need to collect the
                    data.
Action           :  This function writes to a file RHEED data, and discription
                    of the data, the images aquired per second.
Postcondition    :  The file is still open as it leaves this function
*/ char buffer[LINE_LENGTH];
        int counter;

sprintf (buffer, "RHEED ANALYSIS SOFTWARE SAMPLE RATE = %f\n",
                ( (double) num_of_pts / time) );
         fprintf (file_ptr, "%s\n", discription);

for (counter=0; counter < num_of_pts; counter++)
            {
                fprintf (file_ptr, "%f\n", data[counter]);
            }
}

/************************************************************************/ void CollectStaticData(
                        type_crosshair  *crosshair,
                        type_box        *box,
                        double          data[],
                        int             *num_pts,
                        boolean         visual_tracking,
                        double          *elapsed_time
                        )
/*
Precondition    :  *crosshair, *box, data, *num_pts, visual_tracking, and
                   *elapsed_time, are all passed into this function. *crosshair
                   contains the initial position of the electron diffraction
                   data. The value of *box & data as it enters this function is
                   irrevelent. *num_pts contins the number of data points that
                   should be sampled. visual_tracking is a boolean value that
                   determines if a tracking symbol should be displayed on the
                   screen in real time. Finally the value of *elapsed_time as
                   it enters this function is irrevelent.
Action          :  This function collects static RHEED data. Each peak intensity
                   is keep in data[]. If visual_tracking is set to true this
                   function will display a vertical line segment representing
                   the location of the electron diffraction data of intreset.
                   *elapsed_time will contain the time it took for this function
                   to collect the electon diffraction data. If the user hits
                   any key during data aquisition, data aquisition will stop.
Postcondition   :  data and *num_pts will be passed out of this function. data
                   will the peak intensitis of the electon diffraction data, and
                   num_pts will contian the number of points taken.
*/

{
  int counter;
  char trash_char;
  struct timeb start_time;
  struct timeb end_time;

ClearScreen();
  printf("\n\n\n\n PRESS <RETURN> TO START RECORDING DATA");
  trash_char = getchar();
  printf("\n\n\n\n RECORDING DATA");
  printf("\n\n\n\n PRESS <RETURN> TO STOP RECORDING DATA");
  if (visual_tracking)

ftime (&start_time);
        for (counter=0; counter < *num_pts; counter++)
            {
                GetImage();
                PrintNewBox(box);
```

```
                data[counter] = AverageBoxIntensity(crosshair, box);
                if (kbhit())
                    brea!
                }
            }
            ftime (&end_time);
        }
        else
        {
            ftime (&start_time);
            for (counter=0; counter < *num_pts; counter++)
                {
                    GetImage();
                    data[counter] = AverageBoxIntensity(crosshair, box);
                    if (kbhit())
                        {
                            break;
                        }
                }
            ftime (&end_time);
        }
        *elapsed_time = SECONDS(end_time) - SECONDS(start_time);
        *num_pts = counter;
        ClearScreen();
        printf("\n\n\n\n                    DATA AQUISITION AS ENDED\n");
        trash_char = getch();
}

/*****************************************************************/ void CreateTrackingBox(type_box *box)

/*
Precondition  : box is passed into this function.  *box has been initialize
                and has a box area of zero.
Action        : This function creates a box of MAX_AREA is area.
Postcondition : *box is passed out of this function.
*/

{
    ResizeUp(box, DEFAULT_BOX_SIZE, MAX_AREA);
    ResizeLeft(box, DEFAULT_BOX_SIZE, MAX_AREA);
}

/*****************************************************************/ double AverageBoxIntensity (type_crosshair *crosshair,
                            type_box       *box)

/*
Precondition  : crosshair and box are both passed into this function.
                *crosshair and *box contian the location of the electron
                diffraction pattern of intrest.
Action        : This function finds the average intensity of a pixel or
                a region of pixels.  If the box are is not zero this
                function will average all the pixel with the box.  If
                the box area is zero, this function will return the the
                pixel value of the center of the crosshair.
Postcondition : The average value is returned.
*/
        int num_col;
        int num_row;
        int counter;
        double sum=0;
        double box_area;
        static TYPE_BYTE area[MAX_AREA];
        TYPE_BYTE pixel[1];
```

```
    if ( MINIMUM_BOX_SIZE(box) )
        {
        PE_GET_RGN (box->new_pos.top_left_coor.y-1,
                    box->new_pos.top_left_coor.x-1,
                    box->new_pos.bot_right_coor.y-1,
                    box->new_pos.bot_right_coor.x-1,
                    &num_col, &num_row, area, PIXEL_TYPE);
        box_area = BOX_AREA(box);

for (counter = 0; counter < box_area; counter++)
            {
            sum += (double) area[counter];
            } return ( ( sum / (double) counter) );
        }
    else
        {
        counter = 1;
        PE_GET_LINE( CENTER_Y(crosshair), CENTER_X(crosshair),
                    &counter, pixel, PIXEL_TYPE);
        return ( (double) pixel[0] );
        }
}

/******************************************************************************/ void SelectStaticPixels(
                        type_crosshair *crosshair,
                        type_box       *box
                        )

/*
Precondition    :  crosshair and box are both passed into this function.  The
                   value of both crosshair and box as they are passed into this
                   function are irrevelent.
Action          :  This function allows the user to chose the initial
                   defraction data position on the screen through the use
                   of the crosshair and box on the screen. The user can ethier
                   use the keyboard or mouse to control the crosshair and
                   box.  This function is for static RHEED data.
Postcondition   :  crosshair and box are passed out of this function containing
                   the initial position of the electron diffraction data.
*/

{
    boolean end = FALSE;
    boolean resize = FALSE;
    boolean change_color = FALSE;
    int increment = 1;

InitializeCrosshair(crosshair);
    InitializeBox(box);
    while (!end)
        {
        GetImage();
        PutCrosshairsAndBoxOnScreen(crosshair, box, &change_color);
        GetAndProcessMouseInput(crosshair, box, &resize, &end);
        GetAndProcessKeyboardInput(crosshair, box, &increment, &resize,
                                    &end, &change_color);
        }
}

/******************************************************************************/ void PrintStaticInstructions(void)

/*
Precondition    :  None.
Action          :  This function prints the instructions needed to select
                   initial static RHEED data.
```

Postcondition : None.
*/

```
{
   ClearScreen();
   printf("\n\n");
   printf("          USE THE MOUSE OR KEYBOARD TO SELECT DIFFRATION PATTERN
   printf("\n\n            KEY                                  COMMAND\n"
   printf("            ===                                  =======\n");
   printf("\n");
   printf("        <SPACE BAR>                          CHANGE CROSSHAIR
   printf("            q                                QUIT SELECTION MO
   printf("            +                                INCREASE CURSOR S
   printf("            -                                DECREASE CURSOR S
   printf("            r                                CURSOR/BOX CONTRO
   printf("        <UP ARROW>                           MOVE CURSOR OR BO
   printf("        <DOWN ARROW>                         MOVE CURSOR OR BO
   printf("        <LEFT ARROW>                         MOVE CURSOR OR BO
   printf("        <RIGHT ARROW>                        MOVE CURSOR OR BO
   printf("           MOUSE                             MOVE CURSOR OR BO
   printf("      LEFT MOUSE BUTTON                      QUIT SELECTION MO
   printf("      RIGHT MOUSE BUTTON                     CURSOR/BOX CONTRO
   printf("\n\n          PLEASE LOCATE PATTERN AS CLOSE TO CENTER OF SCREEN A
}
```

/*****************************************************************/ void PutCrosshairsAndBoxOnScreen(
                            type_crosshair  *crosshair,
                            type_box        *box,
                            boolean         *change_color
                            )

/*
Precondition  :  crosshair, box and change_color are all passed into this
                 function. *crosshair contain the new and old position of th
                 crosshair on the screen, and *box contains the new and old
                 positions and well as dimensions of the box on the screen.
                 change_color is a boolean value.
Action        :  This function will change the position of the crosshair and
                 box on the screen as specified by the the new positon fields
                 in crosshair and box. If *change color is TRUE, the functio
                 will reverse the color of the crosshair and box on the
                 screen.
                 crosshai   and box will contain its  revious and new
                 positions.  They will also contain saved the screen data
                 destroyed by writing the crosshair and box image to Frame
                 Grabber memory.  The value of shadow_crosshair and
                 shadow_box will contain the current position of the crosshai
                 and box as well as the image of the box and crosshair that
                 are displayed on the screen.
*/

```
{
   static boolean initialize = TRUE;
   static type_crosshair shadow_crosshair;
   static type_box shadow_box;

if (*change_color)
      {
         NotCrosshair(&shadow_crosshair);
         NotBox(&shadow_box);
         *change_color = FALSE;
      } if (initialize)
      {
         InitializeCrosshair(&shadow_crosshair);
         InitializeBox(&shadow_box);
         initialize = FALSE;
      }

SaveNewScreen(crosshair, box);
   shadow_crosshair.new_pos = crosshair->new_pos;
```

```
    crosshair->old_pos = crosshair->new_pos;
    shadow_box.new_pos = box->new_pos;
    box->old_pos = box->new_pos;

PrintNewScreen(&shadow_crosshair, &shadow_box);
}

/******************************************************************/ void GetAndProcessMouseInput (
                             type_crosshair  *crosshair,
                             type_box        *box,
                             boolean         *resize,
                             boolean         *end
                             )
/*
Precondition  : crosshair, box, resize, and end are all passed into this
                function. *crosshair contains the location of the
                crosshairs on the screen. *box contians the location of
                the box on the screen. *resize contains a boolean value
                determining whetheir box resize mode is in effect. Finally,
                the value of *end as it is passed into this function is
                irrevelent.
Action        : This function changes the value of the crosshairs location,
                box location, and box size by mouse control. If the value
                of *resize is TRUE, mouse movement will correspond to
                box resizeing. If *resize is FALSE, mouse movement will
                correspond to box and crosshair location movement. If the
                left mouse button is pressed *end will be set to TRUE and
                this will represent the end of initial diffraction
                selection.
Postcondition : The new location or size of the box and the crosshair will
                be passed out of this function  If *end is set to TRUE
*/

{
    union REGS inregs, outregs;
    int new_x, new_y;
    static int old_x=INITIAL_X;
    static int old_y=INITIAL_Y;
    int offset_x, offset_y;

inregs.x.ax = GET_MOUSE_PHYSICAL_POSITION;
    int86(MOUSE_INTERRUPTS, &inregs, &outregs);

offset_x = outregs.x.cx;
    offset_y = outregs.x.dx;

inregs.x.ax = GET_MOUSE_POSITION;
    int86(MOUSE_INTERRUPTS, &inregs, &outregs);

if (RIGHT_BUTTON_PRESSED(outregs.x.bx))
        {
            *resize = !(*resize);
        } if (LEFT_BUTTON_PRESSED(outregs.x.bx))
        {
            *end = TRUE;
        } if (*resize)
        {
            if (POSITIVE(offset_x) && POSITIVE(offset_y))
                {
                    ResizeRight(box, offset_x);
                    ResizeDown (box, offset_y);
                }
            else if (POSITIVE(offset_x) && NEGATIVE(offset_y))
                {
```

```
                offset_y = offset_y * -1;
                ResizeUp (box, offset_y, MAX_AREA);
                ResizeRight(box, offset_x);
            }
            else if (NEGATIVE(offset_x) && POSITIVE(offset_y))
            {
                offset_x = offset_x * -1;
                ResizeLeft(box, offset_x, MAX_AREA);
                ResizeDown (box, offset_y);
            }
            else
            {
                offset_x = -1 * offset_x;
                offset_y = -1 * offset_y;
                ResizeLeft(box, offset_x, MAX_AREA);
                ResizeUp (box, offset_y, MAX_AREA);
            }
    }
    else
    {
        if (POSITIVE(offset_x) && POSITIVE(offset_y))
        {
            ShiftRight(crosshair, box, offset_x);
        }
        else if (POSITIVE(offset_x) && NEGATIVE(offset_y))
        {
            offset_y = offset_y * -1;
            ShiftRight(crosshair, box, offset_x);
            ShiftUp (crosshair, box, offset_y);
        }
        else if (NEGATIVE(offset_x) && POSITIVE(offset_y))
        {
            offset_x = offset_x * -1;
            ShiftLeft(crosshair, box, offset_x);
            ShiftDown (crosshair, box, offset_y);
        }
        else
        {
            offset_x = -1 * offset_x;
            offset_y = -1 * offset_y;
            ShiftLeft(crosshair, box, offset_x);
            ShiftUp (crosshair, box, offset_y);
        }
    }
}

/***************************************************************************/ void GetAndProcessKeyboardInput (
                        type_crosshair   *crosshair,
                        type_box         *box,
                        int              *increment,
                        boolean          *resize,
                        boolean          *end,
                        boolean          *change_color
                        )

/*
Precondition  : crosshair, box, resize, and end are all passed into this
                function. *crosshair contains the location of the
                crosshairs on the screen. *box contians the location of
                the box on the screen. *resize contains a boolean value
                determining whetheir box resize mode is in effect.
                The value of *end as it is passed into this function is
                irrevelent. The value of *change_color as it is passed
                into this function is irrevelent.
Action        : This function changes the value of the crosshairs location,
                box location, and box size by keyboard control. If the valu
                of *resize is TRUE, mouse movement will correspond to
                box resizing. If *resize is FALSE, mouse movement will
                correspond to box and crosshair location movement.
```

Postcondition : The new location or size of the box and the crosshair will
be passed out of this function. If *end is set to TRUE
this will signify the end to screen selection mode. If
*change_color is set to true the color of the box and
the crosshairs should be reversed.
*/

```
{
    char key;

if (key = KeyPressed())
        {
        switch (key)
            {
                                                              *resize,*increment);
                                    break;
            case DOWN_ARROW   : MoveCrosshairAndBox(crosshair,box, down,
                                                   *resize, *increment);
                                break;
            case RIGHT_ARROW  : MoveCrosshairAndBox(crosshair,box,right,
                                                   *resize, *increment);
                                break;
            case LEFT_ARROW   : MoveCrosshairAndBox(crosshair,box,left,
                                                   *resize, *increment);
                                break;
            case RESIZE       : *resize = !(*resize);
                                break;
            case PLUS         : (*increment == 31) ? (*increment = 1):
                                (*increment += STEP);
                                break;
            case MINUS        : (*increment ==1) ? (*increment = 31):
                                (*increment -= STEP);
                                break;
            case CHANGE_COLOR : *change_color = TRUE;
                                break;
            case QUIT         : *end = TRUE;
                                break;
            }
        }
}
```

/****************************************************************/ int KeyPressed(void)

/*
Precondition   : None.
Action         : This functions checks to see if a key has been pressed.
Postcondition  : This function will return the value of the key that has been
                 been pressed. If no key has been pressed, FALSE will be
                 returned.
*/

```
{
    int key_pressed='a';

if (kbhit())
        {
        key_pressed = getch();
        return (key_pressed);
        }
    return (FALSE);
}
```

/****************************************************************/ void GetImage(void)

/*
Precondition   : The Frame Grabber board has been initialized, and has the
                 external sync set.

Action        : This function aquires an image from the an external source
                onto the Frame Grabbers onboard frame store.
Postcondition : The aquired image will reside in the Frame Grabbers memory.
*/
    PE_ACQUIRE();
}

/******************************************************/ void InitializeBox(type_box *box)

/*
Precondition  : box is passed into this function. The value of box as it
                enters into this function is irrevelent.
Action        : This function initializes the *box to have an area of zero
                and location at the center of the screen. This function also
                initializes the color of the box.
Postcondition : *box is passed out of this function contianing its new
                initialized values.
*/ box->new_pos.top_left_coor.x = INITIAL_X;
    box->new_pos.top_left_coor.y = INITIAL_Y;
    box->new_pos.top_right_coor.x = INITIAL_X;
    box->new_pos.top_right_coor.y = INITIAL_Y;
    box->new_pos.bot_left_coor.x = INITIAL_X;
    box->new_pos.bot_left_coor.y = INITIAL_Y;
    box->new_pos.bot_right_coor.x = INITIAL_X;
    box->new_pos.bot_right_coor.y = INITIAL_Y;
    box->old_pos = box->new_pos;
    InitializeArray(box->top_side, MAX_SIDE_LENGTH);
    InitializeArray(box->bot_side, MAX_SIDE_LENGTH);
    InitializeArray(box->left_side, MAX_SIDE_LENGTH);
    InitializeArray(box->right_side, MAX_SIDE_LENGTH);

/**********************************************************************/ void InitializeCrosshair(type_crosshair *shadow)

*
recondition   : shadow is passed into this function. The value of shadow
                upon entering this function is irrevelent.
Action        : This function initialize the crosshair by centering its
                coordinates to the center of the screen and initializing
                its color to 256th grey level.
Postcondition : shadow is passed out of this function containing its
                initialized value.
/ shadow->new_pos.line_coor.x= INITIAL_X - (int) MAX_CROSSHAIR_LENGTH/2;
    shadow->new_pos.line_coor.y= INITIAL_Y;
    shadow->new_pos.col_coor.x= INITIAL_X;
    shadow->new_pos.col_coor.y= INITIAL_Y - (int) MAX_CROSSHAIR_LENGTH/2;
    shadow->old_pos = shadow->new_pos;
    InitializeArray (shadow->line_hair, MAX_CROSSHAIR_LENGTH);
    InitializeArray (shadow->col_hair, MAX_CROSSHAIR_LENGTH);

/**********************************************************************/ void InitializeArray(TYPE_BYTE  in_array[],
                     int        num_elements)
                the value of in_array as it is passed into this function is
                irrelevent. num_elements contains i  size of in_array.
Action        : This function set all the element within in_array to the
                constant SHADOW_INTENSITY.
Postcondition : in_array is passed out of this function with all its
                elements containing SHADOW_INTENSITY.
*/

```
{
    int counter;

for (counter=0; counter <  num_elements; counter++)
        {
            in_array[counter] = SHADOW_INTENSITY;
        }
}
```

/***********************************************************************/

```
void InitializeFrameGrabber()
```

/*
Precondition  : The Quick Capture board DT2953 is installed and the
                Developer's Kit device driver is loaded.
Action        : This function will initialize the DT2953 so that input can
                be taken from the external source.
Postcondition : Single frame images can now be aquired onto the DT2953
                on board frame store.
*/

```
{
    PE_OPEN ();
    PE_RESET ();
    PE_SET_SYNC (SYNC_STATE);
}
```

/***********************************************************************/

```
void PrintTitleScreen(void)
```

/*
Precondition  : This function should be called before any other output to
                the screen is sent.
Action        : This function prints the title and other information to the
                screen.
Postcondition : none.
*/

```
{
    char ch;

ClearScreen();
    printf("\n\n\n\n\n");
    printf("      R O T A T I O N A L    R H E E D    A N A L Y S I S    S O F
    printf("\n\n\n");
    printf("                   M. I. T.    L I N C L O N    L A B O R A T O R Y \n")
    printf("\n\n\n");
    printf("\n\n\n\n\n                                PRESS <RETURN> TO CONTINUE");
    ch = getchar();
}
```

/***********************************************************************/

```
                        int      *num_of_pts,
                        char     filename[],
                        char     discription[],
                        boolean  *tracking,
                        boolean  *visual_tracking
                        )
```

/*
Precondition  : num_of_pts, filename, discription, tracking, visual_tracking
                and data_type are all passed into this function. The values
                of these variables as they enter into this function are
                irrevelent.
Action        : This function prompts and get from the user the following
                information :  the number of sample points to take
                (*num_of_pts), the filename of the data file to store the
                data (filename), the discription the user wants in the
                discription field of the data file (discription), whethier
                or not the program is to track non rotating RHEED data, or

```
                            rotating RHEED data (*tracking), and whether the user wants
                            the area of intrest to be displayed on the screen in
                            real time (*visual_tracking).
Postcondition :             num_of_pts, filename, discription, tracking, visual_tracking
                            and data_type are all passed out of this function containing
                            values entered by the user.
*/
{
    char line [LINE_LENGTH];
    char buffer [LINE_LENGTH];
    boolean done = FALSE;
    int max_pts=0;

while (!done)
        {
            *num_of_pts = 0;
            ClearScreen();
            printf("\n\n\n\n");

printf ("Do you want Rotating or Static RHEED analysis (R / S) : ");
            gets(line);
            printf("\n");
            if ( (line[0] == 'R') || (line[0] == 'r') )
                {
                    *tracking = TRUE;
                    max_pts = MAX_DYNAMIC_DATA_PTS;
                }
            else
                {
                    *tracking = FALSE;
                    max_pts = MAX_STATIC_DATA_PTS;
                } sprintf(buffer, "Please enter the number of sample points [0 - %d]",
                    max_pts );

printf(buffer);
            gets(line);
            printf("\n");
            sscanf(line, "%d", num_of_pts);

if (*num_of_pts > max_pts)
                {
                    printf(" ERROR! %d is the maximum number of pts possible\n",
                           max_pts);
                } if ( !(*num_of_pts) || num_of_pts < 0 )
                {
                    *num_of_pts = max_pts / 2;
                } line[0] = '\0';
            printf ("Enter output file name : ");
            gets(line);
            if (!line[0])
                {
                    sprintf(filename, "%s", DEFAULT_FILE_NAME);
                }
            else
                {
                    sprintf(filename, "%s", line);
                }
            printf("\n");

line[0] = '\0';
            printf ("Enter file discription : ");
            gets(line);
            printf("\n");
            sprintf(discription, "%s", line);

printf ("Do you want visual tracking in real time (Y / N) : ");
            gets(line);
```

```
            printf("\n");
            if ( (line[0] == 'Y') || (line[0] == 'y') )
                {
                    *visual_tracking = TRUE;
                }
            else
                {
                    *visual_tracking = FALSE;
                } printf ("THESE ARE YOUR SELECTIONS   : \n\n\n");
            printf (" number of sample points : %d\n", *num_of_pts);
            printf (" output file name : %s\n", filename);
            printf (" output file discription : %s\n", discription);

if (*tracking)
                {
                    printf (" Dynamic RHEED analysis \n");
                }
            else
                {
                    printf (" Static RHEED analysis \n");
                } if (*visual_tracking)
                {
                    printf (" Visual tracking in Real time. \n");
                }
            else
                {
                    printf (" No Visual tracking in Real time. \n");
                } printf("\n ARE THEY CORRECT (Y / N) : ");
            gets(line);

{
                    done = TRUE;
                }
            else
                {
                    done = FALSE;
                }
        }
}

/**************************************************************************/

FILE *OpenFile (char filename[])

/*
Precondition   :   filename is passed into this function.  filname contains a
                   valid dos filename wh'os file has no been open.
Action         :   This function open a file for writing with the name
                   given in the filename variable and returns a pointer to
                   that file.
Postcondition  :   The previous contents of the opened file will be erased.
*/

{
    FILE *file_pointer;

if ( !(file_pointer = fopen (filename, "w")) )
        {
            printf ("ERROR! Cannot open file.\n");
            exit (ERROR);
        } return( file_pointer );
}

/**************************************************************************/
```

```
void MoveCrosshairAndBox(type_crosshair   *crosshair,
                         type_box         *box,
                         type_direction   direction,
                         boolean          resize,
                         int              increment)
/*
Precondition   :  crosshair, box, direction, resize, and increment are all
                  passed into this function. *crosshair and *box contain the
                  current locations of the box on the screen. resize contains
                  whether the box should be resized, and increment determines
                  the number of pixel to skip for each movement.
Action         :  This function resized or moves the location of the box
                  and/or the crosshair on the screen, depending on the boolean
                  value of resize. All movements will be made over increment
                  pixels.
Postcondition  :  This function will pass out *crosshair, and *box with its ne
                  position or location.

if (resize)
        {
        switch (direction)
            {
                case up    :  ResizeUp(box, increment, MAX_AREA); break;
                case down  :  ResizeDown(box, increment); break;
                case left  .  ResizeLeft(box, increment, MAX_AREA); break;
            }
        }
    else
        {
        switch(direction)
            {
                case up    :  ShiftUp (crosshair, box, increment);break;
                case down  :  ShiftDown (crosshair, box, increment);break;
                case right :  ShiftRight (crosshair, box, increment);break;
                case left  :  ShiftLeft (crosshair, box, increment);break;
            }
        }
}

/**************************************************************************/ void ResizeUp (type_box *box,
               int increment,
               int max_area)

/*
Precondition   :  box, increment, and max_area are all passed into this
                  function. *box contians the location and size of the
                  box on the screen. increment contains the length
                  the box is supposed to be increased, and max_area is
                  the maximum size the box is allowed to be.
Action         :  This function enlargenes the height of the box specified by
                  the corrdinates in *box by a length specified by increment.
                  If the new box size is greater than the maximum allowable
                  are of the box as specified by max_area, then the box area
                  will equal the size of max_area.
Postcondition  :  box will be passed out of this function containing its new
                  size.
*/

{
    if ( (box->new_pos.top_left_coor.y > (0 + increment)) &&
         (box->new_pos.bot_left_coor.y < (MAX_Y - increment)) &&
         (NEW_BOX_SIZE_Y(box, increment) < max_area) )
        {
            box->new_pos.top_left_coor.y-=increment;
            box->new_pos.top_right_coor.y-=increment;
            box->new_pos.bot_left_coor.y+=increment;
            box->new_pos.bot_right_coor.y+=increment;
        }
}
```

```
void ResizeRight (type_box *box,
                  int Increment)
/*
Precondition   : box, increment, and max_area are all passed into this
                 function.  *box contians the location and size of the
                 box on the screen.  increment contains the length
                 the box is supposed to be decreased.
Action         : This function decreases the length of the box specified by
                 the corrdinates in *box by a length specified by increment.
Postcondition  : box will be passed out of this function containing its new
                 size.
*/
{
   if ( (box->new_pos.top_right_coor.x - increment)
        (box->new_pos.top_left_coor.x + increment))
      {
         box->new_pos.top_left_coor.x   += increment;
         box->new_pos.top_right_coor.x  -= increment;
         box->new_pos.bot_left_coor.x   += increment;
         box->new_pos.bot_right_coor.x  -= increment;
      }
}

/***********************************************************************/ void ResizeLeft (type_box  *box,
                 int increment,
                 int max_area)
/*
Precondition   : box, increment, and max_area are all passed into this
                 function.  *box contains the location and size of the
                 box on the screen.  increment contains the length
                 the box is supposed to be increased, and max_area is
                 the maximum size the box is allowed to be.
Action         : This function enlargenes the length of the box specified by
                 the corrdinates in *box by a length specified by increment.
                 If the new box size is greater than the maximum allowable
                 are of the box as specified by max_area, then the box area
                 will equal the size of max_area.
Postcondition  : box will be passed out of this function containing its new
                 size.
*/

{
   if ( (box->new_pos.top_left_coor.x > (0 + increment)) &&
        (box->new_pos.top_right_coor.x < (MAX_X - increment) &&
        (NEW_BOX_SIZE_X (box, increment) < max_area) )
      {
         box->new_pos.top_left_coor.x   -= increment;
         box->new_pos.top_right_coor.x  += increment;
         box->new_pos.bot_left_coor.x   -= increment;
         box->new_pos.bot_right_coor.x  += increment;
      }
}

/***********************************************************************/ void ResizeDown (type_box *box,
                 int Increment)
/*
Precondition   : box, increment, and max_area are all passed into this
                 function.  *box contians the location and size of the
                 box on the screen.  increment contains the length
                 the box is supposed to be decreased.
Action         : This function decreases the height of the box specified by
                 the corrdinated in *box by a length specified by increment.
Postcondition  : box will be passed out of this function containing its new
                 size.
*/
```

```
{
    if ((box->new_pos.bot_left_coor.y - increment) >=
        (box->new_pos.top_left_coor.y + increment))
        {
            box->new_pos.top_left_coor.y+= increment;
            box->new_pos.top_right_coor.y+=increment;
            {
            box->new_pos.bot_right_coor.y-=increment;
        }
}
```

/****************************************************************/

```
void ShiftRight (type_crosshair  *crosshair,
                 type_box         *box,
                 int              increment)
```

/*
Precondition  : crosshair, box, and increment, are all passed into this
                function. *crosshair contain the location of the crosshair
                on the screen, box contains the location of the box on the
                screen. increment contains the number of pixels that the
                screen and crosshair locations should be shifted by.
Action        : The function shifts right the location of *crosshair and
                *box on the screen by increment number of pixel. This shift
                will not allow the box or the crosshair to move off the side
                of the screen.
Postcondition : *box and *crosshair are passd out of this function
                containing the new values
*/

```
{
    if (((CROSSHAIR_BOTTOM(crosshair->new_pos.col_coor.x) + increment) < MAX_X
        (box->new_pos.top_right_coor.x + increment < MAX_X) )
        {
            crosshair->new_pos.col_coor.x+=increment;
            crosshair->new_pos.line_coor.x+=increment;
            box->new_pos.top_left_coor.x+=increment;
            box->new_pos.top_right_coor.x+=increment;
            box->new_pos.bot_left_coor.x+=increment;
            box->new_pos.bot_right_coor.x+=increment;
        }
}
```

/****************************************************************/

```
void ShiftLeft (type_crosshair  *crosshair,
                type_box         *box,
                int              increment)
```
/*
Precondition  : crosshair, box, and increment, are all passed into this
                function. *crosshair contain the location of the crosshair
                on the screen, box contains the location of the box on the
                screen. increment contains the number of pixels that the
                screen and crosshair locations should be shifted by.
Action        : The function shifts left the location of *crosshair and
                *box on the screen by increment number of pixel. This shift
                will not allow the box or the crosshair to move off the side
                of the screen.
Postcondition : *box and *crosshair are passd out of this function
                containing the new values
*/

```
{
    if ( (crosshair->new_pos.col_coor.x - increment> 0 ) &&
        ((box->new_pos.top_left_coor.x - increment) > 0 ) )
        {
            crosshair->new_pos.col_coor.x-=increment;
            crosshair->new_pos.line_coor.x-=increment;
            box->new_pos.top_left_coor.x-=increment;
            box->new_pos.bot_left_coor.x-=increment;
            box->new_pos.bot_right_coor.x-=increment;
        }
```

/****************************************************************/

```
void ShiftDown (type_crosshair  *crosshair,
                type_box        *box,
                int             increment);
```

```
/*
Precondition  : crosshair, box, and increment, are all passed into this
                function. *crosshair contain the location of the crosshair
                on the screen, box contains the location of the box on the
                screen. increment contains the number of pixels that the
                screen and crosshair locations should be shifted by.
Action        : The function shifts down the location of *crosshair and
                *box on the screen by increment number of pixel. This shift
                will not allow the box or the crosshair to move off the side
                of the screen.
Postcondition : *box and *crosshair are passd out of this function
                containing the new values
*/

{
   if ( ((CROSSHAIR_BOTTOM(crosshair->new_pos.col_coor.y)+increment) < MAX_Y
       ((box->new_pos.bot_left_coor.y  + increment) < MAX_Y ) )
       {
          crosshair->new_pos.col_coor.y+=increment;
          crosshair->new_pos.line_coor.y+=increment;
          box->new_pos.top_left_coor.y+=increment;
          box->new_pos.top_right_coor.y+=increment;
          box->new_pos.bot_left_coor.y+=increment;
          box->new_pos.bot_right_coor.y+=increment;
       }
}
```

/****************************************************************/

```
void ShiftUp (type_crosshair  *crosshair,
              type_box        *box,
              int             increment)
/*
Precondition  : crosshair, box, and increment, are all passed into this
                function. *crosshair contain the location of the crosshair
                on the screen, box contains the location of the box on the
                screen. increment contains the number of pixels that the
                screen and crosshair locations should be shifted by.
Action        : The function shifts up the location of *crosshair and
                *box on the screen by increment number of pixel. This shift
                will not allow the box or the crosshair to move off the side
                of the screen.
Postcondition : *box and *crosshair are passd out of this function
                containing the new values
*/

{
   if ( ((crosshair->new_pos.col_coor.y - increment) > 0) &&
       ((box->new_pos.top_left_coor.y - increment) > 0) )
       {
          crosshair->new_pos.col_coor.y-=increment;
          crosshair->new_pos.line_coor.y-=increment;
          box->new_pos.top_left_coor.y-=increment;
          box->new_pos.top_right_coor.y-=increment;
          box->new_pos.bot_left_coor.y-=increment;
          box->new_pos.bot_right_coor.y-=increment;
       }
}
```

/****************************************************************/

```
void NotBox(type_box *box)

/*
```

Precondition  : box is passed into this function. The value of *box as it
                is passed into this function is irrelevent.
Action        : This function reverses the color of the box to be displayed
                on the screen.
Postcondition : box is passed out of this function containing it new color.
*/

{
   NotArray(box->top_side, MAX_SIDE_LENGTH);
   NotArray(box->bot_side, MAX_SIDE_LENGTH);
   NotArray(box->left_side, MAX_SIDE_LENGTH);
   NotArray(box->right_side, MAX_SIDE_LENGTH);
}

/****************************************************************/ void NotCrosshair(type_crosshair *shadow)

/*
Precondition  : shadow is passed into this function. The value of
                *shadow upon entering this function is irrelevent.
Action        : This function reverses the colors of the crosshairs, by
                inversing the vales of the arrays contained in *shadow.
Postcondition : shadow is passed out of this function containing its new
                values.
*/

{
   NotArray (shadow->line_hair, MAX_CROSSHAIR_LENGTH);
   NotArray (shadow->col_hair, MAX_CROSSHAIR_LENGTH);
}

/****************************************************************/ void SaveNewScreen (type_crosshair *crosshair,
                    type_box       *box)

/*
Precondition  : crosshair and box are passed into this function. *crosshair
                and *box contian the coordinates of the new box and
                crosshair to be displayed on the screen. Frame Grabber
                memory contains screen information.
Action        : This function saves the data in Frame Grabber memory that is
                to be distroyed when displaying the crosshair and box on
                the screen. The data to be saved will be stored in the
                arrays contianed in *crosshair and *box.
Postcondition : *crosshair and *box will be passed out of this function
                containing screen data over which the new crosshair and box
                will be printed
*/

{
   SaveNewCrosshair(crosshair);
   SaveNewBox(box);
}

/****************************************************************/ void SaveNewCrosshair(type_crosshair *crosshair)

/*
Precondition  : crosshair is passed into this function. *crosshair contians
                the corrdinates of the next position of the crosshair on
                the screen. Frame Grabber memory contains screen data.
Action        : This function gets from Frame Grabber memory screen data
                where the new crosshair image will be overwritten.
Postcondition : The array in crosshair will contain this new screen
                information.
*/

{
   int requested_pixels = MAX_CROSSHAIR_LENGTH;

```
      PE_GET_LINE(crosshair->new_pos.line_coor.y, crosshair->new_pos.line_coor.x
               &requested_pixels, crosshair->line_hair, PIXEL_TYPE);
      PE_GET_COLUMN(crosshair->new_pos.col_coor.y, crosshair->new_pos.col_coor.x
               &requested_pixels, crosshair->col_hair, PIXEL_TYPE);
}

/****************************************************************/ void SaveNewBox(type_box *box)

/*
Precondition    : box is passed into this function.  *box contian the
                  position of the next box to be displayed on the screen.
                  Frame Grabber memory contains screen data.
Action          : This function gets screen data from Frame Grabber memory
                  over which the next box is to be displayed and stored that
                  data in the arrays contained in *box.
Postcondition   : *box is passed out of this function contianing the new
                  screen data.
*/

{
   int requested_pixels;

requested_pixels = box->new_pos.top_right_coor.x
                    - box->new_pos.top_left_coor.x;

if (requested_pixels)
      {
         PE_GET_LINE(box->new_pos.top_left_coor.y,
                  box->new_pos.top_left_coor.x, &requested_pixels,
                  box->top_side, PIXEL_TYPE);

PE_GET_LINE(box->new_pos.bot_left_coor.y,
                  box->new_pos.bot_left_coor.x, &requested_pixels,
                  box->bot_side, PIXEL_TYPE);
      } requested_pixels = box->new_pos.bot_right_coor.y
   if (requested_pixels)
      {
         PE_GET_COLUMN(box->new_pos.top_left_coor.y,
                  box->new_pos.top_left_coor.x,
                  &requested_pixels, box->left_side, PIXEL_TYPE);

PE_GET_COLUMN(box->new_pos.top_right_coor.y,
                  box->new_pos.top_right_coor.x,
                  &requested_pixels, box->right_side, PIXEL_TYPE);
      }
}

/****************************************************************/ void PrintNewScreen (type_crosshair *crosshair,
                     type_box       *box)

/*
Precondition    : *crosshair and *box are both passed into this function.
                  *crosshair and *box contain positions and image of where
                  the new crosshair and box are to be displayed on the screen.
Action          : This function displays on the screen the a crosshair and
                  box specifed by its coordinates and size in *crosshair and
                  *box.
Postcondition   : The image of the crosshair and box will be stored in
                  Frame Grabber memory.
*/

{
   PrintNewCrosshair(crosshair);
   PrintNewBox(box);
}
```

```
void PrintNewCrosshair(type_crosshair *crosshair)

/*
Precondition  : crosshair is passed into this function. *crosshair contians
                the position and image of the new crosshair to be displayed
                on the screen.
Action        : This function displays a new crosshair image to the screen,
                specified by the value of *crosshair.
Postcondition : The image of the new crosshair will be stored to Frame
                Grabber memory.
*/

{
    int requested_pixels = MAX_CROSSHAIR_LENGTH;

PE_PUT_LINE(crosshair->new_pos.line_coor.y, crosshair->new_pos.line_coor.x
             &requested_pixels, crosshair->line_hair, PIXEL_TYPE);
    PE_PUT_COLUMN(crosshair->new_pos.col_coor.y, crosshair->new_pos.col_coor.x
             &requested_pixels, crosshair->col_hair, PIXEL_TYPE);
}

/*************************************************************************** void PrintNewBox(type_box *box)

/*
Precondition  : box is passed into this function  *box contains the location tion          : This functi  displays and new box imac  on the screen,
                specified by the imformation contained  , *box.
;tcondition   : The image of the new box will be stored to Frame Grabber
                memory.
*/ int requested_pixels;

requested_pixels = box->new_pos.top_right_coor.x
                     - box->new_pos.top_left_coor.x;

if (requested_pixels)
        {
            PE_PUT_LINE(box->new_pos.top_left_coor.y,
                        box->new_pos.top_left_coor.x, &requested_pixels,
                        box->top_side, PIXEL_TYPE);

PE_PUT_LINE(box->new_pos.bot_left_coor.y,
                        box->new_pos.bot_left_coor.x, &requested_pixels,
                        box->bot_side, PIXEL_TYPE);
        } requested_pixels = box->new_pos.bot_right_coor.y
                     - box->new_pos.top_right_coor.y;

if (requested_pixels)
        {
            PE_PUT_COLUMN(box->new_pos.top_left_coor.y,
                          box->new_pos.top_left_coor.x,
                          &requested_pixels, box->left_side, PIXEL_TYPE);

PE_PUT_COLUMN(box->new_pos.top_right_coor.y,
                          box->new_pos.top_right_coor.x,
                          &requested_pixels, box->right_side, PIXEL_TYPE);
        }

/***************************************************************************/ d NotArray (TYPE_BYTE in_array[],
            int       num_elements)
```

```
condition    : in_array and num_elements are both passed into this function.
               The value of in_array is irrevelent as it is passed into this
               function.  num_elements contains the number of elements in
               in_array.
ion          : This function performs a logical not on all the elements in
               in_array.
tcondition   : in_array is passed out of this function containing its new
               values.

int counter;

for (counter=0; counter < num_elements; counter++)
    {
        in_array[counter] = ~in_array[counter];
    }
```

We claim:

1. A method of determining growth properties of a layer of material as it is being grown on a substrate, comprising the steps of:
   a) rotating the substrate upon which the layer is being grown;
   b) subjecting the growing layer to a beam of energy impinging on the layer as the substrate is rotated to modulate the beam by the variations in the growth;
   c) converting the beam modulations into a visual image consisting of frames of pixels;
   d) tracking a selected set of pixels in a frame;
   e) generating time varing data from said set of pixels of the oscillatory variations induced in said beam by said modulations during the growth process;
   f) converting said time varying data to frequency varying data; and
   g) utilizing said frequency varying data to determine growth properties.

2. A method of analyzing the growth process of a layer of material as it is being grown on a substrate, comprising the steps of:
   a) rotating the substrate;
   b) directing a beam of energy onto the growing layer as the substrate is rotated to modulate the beam by the growth process;
   c) forming a visual image of the modulated beam, said image consisting of frames of pixels;
   d) tracking a selected set of pixels in a frame;
   e) from said set of pixels generating time varying data of the variations in the beam induced by said growth process; and
   f) generating frequency varying data corresponding to said time varying data.

3. The method of claim 1 wherein the selected set of pixels consists of a row and column of such pixels.

4. The method of claim 1 wherein the beam of energy is taken from the group comprising electron, photon or X-ray energy and the time varying data relates to data from the group comprising scattered, diffracted, reflected or transmitted beam variations.

5. The method of claim 1 wherein the time varying data is processed to determine the maximum intensity of each frame.

6. The method of claim 1 wherein the growth properties determined are used to control further growth of layers.

7. The method of claim 2 wherein the beam modulation is from the group comprising scattered, diffracted, reflected or transmitted beam modulation.

8. The method of claim 2 wherein the time varying data in claim 2 is processed to determine the maximum intensity of selected pixels in each frame.

9. The method of claim 2 wherein information contained in the frequency varying data is used to control the growth of the layer.

10. Apparatus for controlling the growth of a layer of material grown on a substrate during the growth process, comprising:
    a) apparatus for rotating the substrate;
    b) an energy source for subjecting the growing layer to a beam of energy to produce variations in the energy beam caused by the growth process;
    c) apparatus for detecting such variations in the energy beam caused by the growth process and generating a visual image of such variations, said visual image comprising frames of pixels;
    d) tracking means for tracking a set of such pixels and generating a frequency varying pattern corresponding thereto; and
    e) apparatus for varying the growth of the layer in response to information contained in said pattern.

11. Apparatus for analyzing the growth of a layer of material during growth on a rotating substrate comprising:
    a) apparatus for rotating the substrate;
    b) apparatus for directing a beam of energy at the growth layer as the substrate is rotated to produce variations in the energy beam induced by the growth process;
    c) imaging means for producing an image of said variations comprising frames of pixels;
    d) tracking means for tracking a set of such pixels; and
    e) apparatus for generating a frequency varying beam pattern from said tracked pixels corresponding to variations in the beam induced by said growth.

12. A method of controlling the growth of a layer of semiconductor material as it is being grown on a rotating substrate, comprising the steps of:
    a) rotating the substrate;
    b) subjecting the growing layer to a beam of electron energy to obtain a diffraction pattern;
    c) generating a visual image of said diffraction pattern which is comprises of frames of pixels;
    d) tracking a set of pixels in each frame;

e) from said tracked pixels generating frequency varying data corresponding to oscillatory variations induced in said diffraction pattern; and f) utilizing said frequency varying data to control said growth process.

13. A method of analyzing the growth of a layer of semiconductor material as it is being grown on a rotating substrate comprising the steps of:

a) directing a beam of electron energy onto the growing semiconductor layer forming on said rotating layer;

b) imaging a time varying diffraction beam pattern of frames of pixels corresponding to the variations in the electron beam induced by said growth;

c) tracking a set of pixels in said frames; and d) from said set of pixels generating a frequency varying beam pattern corresponding to said time varying beam pattern.

14. Apparatus for controlling the growth of a layer of semiconductor material on a substrate during the growth process, comprising:

a) apparatus for rotating the substrate;

b) an energy source for subjecting the growing layer to a beam of electron energy to produce a diffraction pattern;

c) apparatus for detecting variations in said electron energy beam caused by the growth process and generating a visual image in response thereto said image comprising frames of pixels;

d) tracking means for tracking a set of pixels in each frame;

e) apparatus for processing set of pixels to produce a frequency varying pattern corresponding thereto.

15. Apparatus for controlling the growth of a layer of semiconductor material being grown on a rotating substrate during the growth process, comprising:

a) apparatus for rotating the substrate;

b) an energy source for subjecting the growing layer to a beam of electron energy to produce a diffraction pattern;

c) apparatus for imaging variations in said electron energy beam caused by the growth process and generating a time-varying pixel pattern in response thereto;

d) apparatus for processing said time varying pixel image pattern to produce a frequency varying pattern corresponding thereto comprising:

(i) apparatus for forming multiple frames of pixels of said image pattern;

(ii) apparatus for selecting a portion of the pixels from said frames;

(iii) apparatus for determining the peak intensity of the pixels selected and for storing data representing said peak intensity in the form of time varying data;

(iv) apparatus for determining the means of the time varying data;

(v) apparatus for determining the baseline trend of the time varying data by fitting a polynomial to the data and subtracting the baseline from the means of the data;

(vi) apparatus for processing the baseline of the time varying data by performing a Fourier transform of the baseline of the time varying data to generate said frequency varying data; and (vii) apparatus for determining the centroid of such frequency varying data.

16. The apparatus of claim 14, including a filter for selectively removing undesired frequency components from said frequency varying pattern.

* * * * *

UNITED STATES PATENT AND TRADEMARK OFFICE
CERTIFICATE OF CORRECTION

PATENT NO. : 5,238,525

DATED : Aug. 24, 1993

INVENTOR(S) : George W. Turner and Adrian J. Isles

It is certified that error appears in the above-identified patent and that said Letters Patent is hereby corrected as shown below:

Col. 70, line 67, delete "comprises" and insert --comprised--.

Col. 72, line 21, delete "means" and insert --mean--.

Signed and Sealed this

Twelfth Day of April, 1994

Attest:

BRUCE LEHMAN

*Attesting Officer*   *Commissioner of Patents and Trademarks*